(12) United States Patent
Suzuka et al.

(10) Patent No.: US 9,029,845 B2
(45) Date of Patent: May 12, 2015

(54) ELECTRODE COMPOSITE AND PHOTOELECTRIC ELEMENT EQUIPPED THEREWITH

(71) Applicants: Panasonic Corporation, Osaka (JP); Waseda University, Tokyo (JP)

(72) Inventors: Michio Suzuka, Osaka (JP); Takashi Sekiguchi, Osaka (JP); Hiroyuki Nishide, Tokyo (JP); Kenichi Oyaizu, Tokyo (JP); Fumiaki Kato, Tokyo (JP)

(73) Assignees: Panasonic Corporation, Osaka (JP); Waseda University, Tokyo (JP)

( * ) Notice: Subject to any disclaimer, the term of this patent is extended or adjusted under 35 U.S.C. 154(b) by 32 days.

(21) Appl. No.: 14/008,025

(22) PCT Filed: Dec. 10, 2012

(86) PCT No.: PCT/JP2012/081877
§ 371 (c)(1),
(2) Date: Sep. 27, 2013

(87) PCT Pub. No.: WO2013/099567
PCT Pub. Date: Jul. 4, 2013

(65) Prior Publication Data
US 2014/0048786 A1    Feb. 20, 2014

(30) Foreign Application Priority Data

Dec. 28, 2011  (JP) ................................ 2011-287220
Sep. 18, 2012  (JP) ................................ 2012-204865

(51) Int. Cl.
*H01L 29/08*   (2006.01)
*H01L 35/24*   (2006.01)
(Continued)

(52) U.S. Cl.
CPC .... *H01L 51/5209* (2013.01); *H01L 31/022425* (2013.01); *H01G 9/2009* (2013.01);
(Continued)

(58) Field of Classification Search
USPC ........................ 257/13, 40, 79–103, 191, 918, 257/E51.018–E51.022, E33.001–E33.077, 257/E33.054, E25.028, E31.058, E31.063, 257/E31.115, E25.032, E27.133–E27.139, 257/252–254, 257–258, 594, 656, 910, 257/E33.046, E27.046, E27.051, 257/E29.327–E29.331, E29.333, 257/E29.219–E29.22, E29.329, E11.503, 257/E21.352, E21.358, E21.36–E21.362, 257/E21.366, E21.367, E29.069–E29.071, 257/E29.245, E49.001–E49.004, 98, 257/642–643, 759, E31.007, 257/E51.001–E51.052, E27.117–E27.119, 257/88, 99, E21.503, E51.008–E25.009, 257/81, 82, 91, 100, 116, 117, 432–437, 257/749, E33.056–E33.059; 438/22–47, 438/69, 493, 503, 507, 956, 16, 82, 99, 51, 438/55, 64–68, 83, 98
See application file for complete search history.

(56) References Cited

U.S. PATENT DOCUMENTS

2003/0057451 A1 *  3/2003  Eriguchi et al. .............. 257/200
2006/0107997 A1    5/2006  Matsui et al.
(Continued)

FOREIGN PATENT DOCUMENTS

JP    10-290018 A     10/1998
JP    2001-257012 A   9/2001
(Continued)

OTHER PUBLICATIONS

International Search Report for corresponding International Application No. PCT/JP2012/081877 mailed Mar. 5, 2013.
(Continued)

*Primary Examiner* — Dao H Nguyen
*Assistant Examiner* — Tram H Nguyen
(74) *Attorney, Agent, or Firm* — Renner, Otto, Boisselle & Sklar, LLP

(57) ABSTRACT

The present invention provides an electrode composite that has a reaction interface with a large area and can constitute a photoelectric element having high electron transport properties between the reaction interface and the electrode. The electrode composite of the present invention includes a first electrode and a conductive particle layer stacked on the first electrode. The conductive particle layer includes conductive particles containing acicular particles. The conductive particle layer has a three-dimensional porous network structure that is formed by the interconnection of the conductive particles. The three-dimensional network structure is joined to the first electrode. The conductive particle layer contains pores having a pore size of 50 nm or more in a total volume of 50% or more based on the volume of all pores in the conductive particle layer.

17 Claims, 3 Drawing Sheets

(51) Int. Cl.
   *H01L 51/00*     (2006.01)
   *H01L 51/52*     (2006.01)
   *H01L 31/0224*   (2006.01)
   *H01G 9/20*      (2006.01)
   *H01B 1/00*      (2006.01)
   *H01L 51/44*     (2006.01)
   *H01B 1/20*      (2006.01)

(52) U.S. Cl.
   CPC ........... *H01G9/2022* (2013.01); *H01G 9/2031* (2013.01); *H01G 9/2059* (2013.01); *H01L 51/004* (2013.01); *H01L 51/0043* (2013.01); *H01L 51/0059* (2013.01); *Y02E 10/542* (2013.01); *H01B 1/00* (2013.01); *H01L 51/441* (2013.01); *H01L 51/442* (2013.01); *H01L 2251/306* (2013.01); *H01B 1/20* (2013.01); *Y02E 10/549* (2013.01)

(56) References Cited

U.S. PATENT DOCUMENTS

2006/0238096 A1*  10/2006  Han et al. ................. 313/311
2012/0119643 A1*   5/2012  Yamamoto ................. 313/504

FOREIGN PATENT DOCUMENTS

| JP | 2002-352870 A | 12/2002 |
| JP | 2004-039286 A | 2/2004 |
| JP | 2005-100792 A | 4/2005 |
| JP | 2005-209567 A | 8/2005 |
| JP | 2006-139961 A | 6/2006 |
| JP | 2006-147411 A | 6/2006 |
| JP | 2007-073198 A | 3/2007 |
| JP | 2007-188809 A | 7/2007 |
| JP | 2008-300044 A | 12/2008 |
| JP | 2009-059646 A | 3/2009 |
| JP | 2009-059687 A | 3/2009 |
| JP | 2011-096399 A | 5/2011 |
| JP | 2011-233312 A | 11/2011 |

OTHER PUBLICATIONS

Form PCT/ISA/237 for corresponding International Application No. PCT/JP2012/081877 dated Mar. 5, 2013.

* cited by examiner

ELECTRODE COMPOSITE AND PHOTOELECTRIC ELEMENT EQUIPPED THEREWITH

TECHNICAL FIELD

The present invention relates to an electrode composite and a photoelectric element equipped with the electrode composite and designed to convert light into electricity or electricity into light.

BACKGROUND ART

In recent years, photoelectric elements designed to convert light into electricity or electricity into light have been used as, for example, power generation devices (photoelectric conversion elements) by photoelectric conversion, such as a photovoltaic cell and a solar cell, light-emitting devices such as an organic EL device, optical display devices such as an electrochromic display device and electronic paper, and sensor devices designed to sense, for example, temperature and light.

The photoelectric element includes an electron transport layer, which is required to have high electron transport properties. With respect to the electron transport layer, an area of a reaction interface as the interface on which charge separation or charge coupling occurs, is an important element.

For example, Patent literature 1 discloses a semiconductor for a photoelectric conversion material including a semiconductor such as titanium oxide adsorbing a dye and a conductive material such as tin oxide. The semiconductor for a photoelectric conversion material is produced by applying a mixture of a semiconductor dispersion liquid and a conductive material dispersion liquid in an appropriate ratio onto a substrate coated with a transparent conductive film and further mixing a spectral sensitizing dye in the film including the mixture of the semiconductor and the conductive material. In the film obtained as above, the conductive material particles are homogeneously distributed in the semiconductor particles. Patent literature 1 also discloses a chemical cell that includes an electrode obtained by such a method of forming a photoelectric conversion material film on a transparent substrate coated with a transparent conductive film, a counter electrode that includes a substrate such as a glass substrate with a conductive film including, for example, platinum, and an electrolyte filled between the electrodes. The chemical cell works as below according to the description in Patent literature 1. Applying sunlight to the semiconductor for a photoelectric conversion material causes the sensitizing dye to absorb light to be excited. Electrons generated by the excitation move to the semiconductor, then pass through the transparent electrode and a load, and reach the counter electrode. The electrons transferred to the counter electrode reduce an oxidation-reduction system in the electrolyte. Meanwhile, the spectral sensitizing dye, from which electrons move to the semiconductor, is in an oxidation state and the oxidized form is reduced by the oxidation-reduction system in the electrolyte to return to the original form. Electrons continuously flow in this manner.

However, by the technique described in Patent literature 1, it is supposed that electrons excited by incident light are trapped by the conductive material having a high electric conductivity during the transfer of electrons in the semiconductor for a photoelectric conversion material including the semiconductor such as titanium oxide adsorbing a dye and the conductive material such as tin oxide, and this interferes with the electron transfer. On this account, the technique described in Patent literature 1 should not improve conversion efficiency.

PRIOR ART DOCUMENTS

Patent Literature

Patent literature 1: JP-A No. 10-290018

SUMMARY OF THE INVENTION

Problems to be Resolved by the Invention

In view of the above circumstances, the present invention has an object to provide an electrode composite that can constitute a photoelectric element having a reaction interface with a large area and having high electron transport properties between the reaction interface and an electrode.

The present invention has another object to provide a photoelectric element that includes the electrode composite and has a reaction interface with a large area and high electron transport properties between the reaction interface and an electrode.

Means of Solving the Problems

An electrode composite of the first invention includes a first electrode and a conductive particle layer stacked on the first electrode. The conductive particle layer includes conductive particles containing acicular particles, the conductive particle layer has a three-dimensional porous network structure, interconnection of the conductive particles forms the three-dimensional network structure, the three-dimensional network structure is joined to the first electrode, and the conductive particle layer contains pores having a pore size of 50 nm or more in a total volume of 50% or more based on the volume of all pores in the conductive particle layer.

An electrode composite of the second invention includes a first electrode and a conductive particle layer stacked on the first electrode. The conductive particle layer is a sintered compact of conductive particles containing acicular particles and is joined to the first electrode, and the conductive particle layer contains pores having a pore size of 50 nm or more in a total volume of 50% or more based on the volume of all pores in the conductive particle layer.

A photoelectric element of the third invention includes the electrode composite, a second electrode arranged opposite to the conductive particle layer of the electrode composite, an electron transport layer and a hole transport layer interposed between the first electrode and the second electrode, and an electrolytic solution. The electron transport layer includes an organic compound having a redox moiety capable of repeated oxidation-reduction, the organic compound and the electrolytic solution form a gel layer, and the pores in the conductive particle layer of the electrode composite are filled with at least some of the gel layer.

Advantageous Effects of Invention

The first invention and the second invention can provide an electrode composite that can constitute a photoelectric element having a reaction interface with a large area and having high electron transport properties between the reaction interface and an electrode.

The third invention can provide a photoelectric element that includes the electrode composite and has a reaction interface with a large area and high electron transport properties between the reaction interface and an electrode.

DESCRIPTION OF EMBODIMENTS

Figure 1:
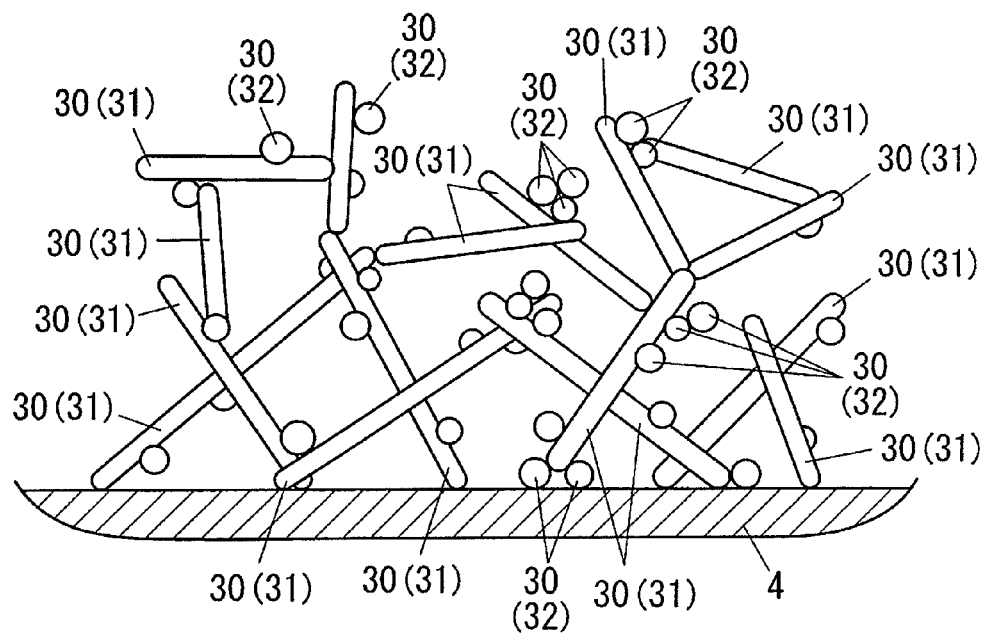
FIG. 1 is a schematic diagram showing a structure of a first electrode and a conductive particle layer in an embodiment of the present invention.

An electrode composite of the first aspect of the present invention includes a first electrode and a conductive particle layer stacked on the first electrode. The conductive particle layer includes conductive particles containing at least acicular particles. The conductive particle layer has a three-dimensional porous network structure that is formed by the interconnection of the conductive particles, and the three-dimensional network structure is joined to the first electrode. The conductive particle layer contains pores having a pore size of 50 nm or more in a total volume of 50% or more based on the volume of all pores in the conductive particle layer.

An electrode composite of the second aspect of the present invention includes a first electrode and a conductive particle layer stacked on the first electrode. The conductive particle layer is a sintered compact of conductive particles containing at least acicular particles and is joined to the first electrode. The conductive particle layer contains pores having a pore size of 50 nm or more in a total volume of 50% or more based on the volume of all pores in the conductive particle layer.

In an electrode composite of the third aspect of the present invention, the conductive particle layer in the first aspect is a sintered compact of the conductive particles containing the acicular particles.

In the first aspect, the second aspect, and the third aspect, an electron route is formed by a plurality of the conductive particles in the conductive particle layer and the routes are connected to the first electrode. On this account, in a photoelectric element including an electron transport layer formed in the pores in the conductive particle layer, the conductive particles improve electron transport properties between the first electrode and the electron transport layer. Furthermore, the conductive particle layer formed to be porous obtains a high specific surface area. This can increase the reaction interface of the photoelectric element when the electron transport layer is formed in the pores in the conductive particle layer. Therefore, using the electrode composite can constitute a photoelectric element having a reaction interface with a large area and having high electron transport properties between the reaction interface and the electrode.

According to the fourth aspect of the present invention, in the electrode composite described in any one of the first to third aspects, the acicular particles have an average major axis length ranging from 100 to 1,000 nm.

In the aspect, the conductive particle layer has a particularly high specific surface area and this further enlarges the reaction area.

According to the fifth aspect of the present invention, in the electrode composite described in any one of the first to fourth aspects, the conductive particles further contain spherical particles having an average particle size of 100 nm or less.

In the aspect, the conductive particle layer has a structure containing spherical particles among acicular particles. The structure improves binding properties among particles to increase the strength of the conductive particle layer and also improves current-carrying properties between particles to further improve electron transport properties between the electron transport layer and the first electrode. The structure also increases the size of pores in the conductive particle layer and can increase, for example, the ratio of pores having a pore size of 50 nm or more as compared with the conductive particle layer including acicular particles alone. In addition, for a conductive particle layer capable of being filled with an equal amount of an electron transport layer, such a structure reduces the total amount of the conductive particles required and thus can improve transparency of the conductive particle layer.

According to the sixth aspect of the present invention, in the electrode composite described in any one of the first to fifth aspects, at least some of the material of the conductive particles is at least one of tin oxide and zinc oxide.

In other words, in the aspect, the conductive particles include particles containing at least one of tin oxide and zinc oxide.

In the aspect, particles containing tin oxide and particles containing zinc oxide have high electric conductivity and have high transparency. This improves the transparency of the conductive particle layer and further improves the electron transport properties between the first electrode and the electron transport layer.

According to the seventh aspect of the present invention, in the electrode composite described in any one of the first to sixth aspects, at least some of the material of the conductive particles is at least one of tin oxide and zinc oxide, the tin oxide is doped with at least one of antimony, fluorine, and indium, and the zinc oxide is doped with at least one of aluminum, gallium, and indium.

In other words, in the aspect, the conductive particles include particles containing at least one of tin oxide and zinc oxide, the tin oxide is doped with at least one of antimony, fluorine, and indium, and the zinc oxide is doped with at least one of aluminum, gallium, and indium.

In the aspect, particles containing tin oxide doped with at least one of antimony, fluorine, and indium and particles containing zinc oxide doped with at least one of aluminum, gallium, and indium have high electric conductivity, high transparency, and high heat resistance. Such a structure improves transparency and heat resistance of the conductive particle layer and further improves the electron transport properties between the first electrode and the electron transport layer.

According to the eighth aspect of the present invention, in the electrode composite described in any one of the first to seventh aspects, the conductive particle layer has a thickness of 100 nm or less.

In the aspect, the conductive particle layer obtains a larger roughness factor. This further improves the electron transport properties between the electron transport layer and the conductive particles and suppresses a side reaction on the surface of the conductive particle layer, thereby further improving the conversion efficiency of a photoelectric element.

A photoelectric element according to the ninth aspect of the present invention includes the electrode composite described in any one of the first to eighth aspects, a second electrode arranged opposite to the conductive particle layer of the electrode composite, an electron transport layer and a hole transport layer interposed between the first electrode and the second electrode, and an electrolytic solution. The electron transport layer includes an organic compound having a redox moiety capable of repeated oxidation-reduction, the organic compound and the electrolytic solution form a gel layer, and the pores in the conductive particle layer of the electrode composite are filled with at least some of the gel layer.

An embodiment of the present invention will now be described in further detail.

Figure 2:
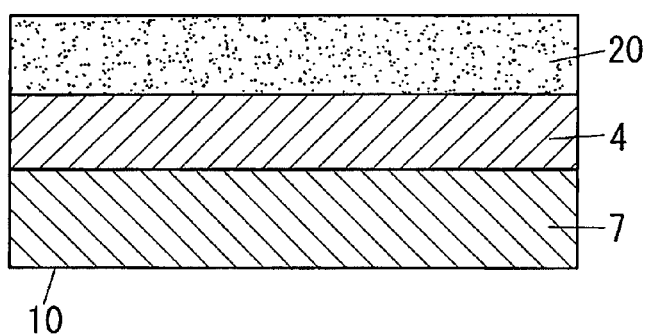
FIG. 2 is a front view showing an electrode composite in an embodiment of the present invention.

An electrode composite 10 of the present embodiment includes a first electrode 4 and a conductive particle layer 20 stacked on the first electrode 4 as shown in FIG. 1 and FIG. 2. In the present embodiment, the electrode composite 10 further includes a first substrate 7.

The first substrate 7 has insulating properties. The first substrate 7 is formed of, for example, glass or an optically transparent film.

The electrode composite 10 is used in order to produce various optical devices, for example. For an optical device including the electrode composite 10 in which the first substrate 7 is required to transmit light, the first substrate 7 desirably has a high light transmittance. In such a case, the first substrate 7 preferably has a light transmittance of 50% or more and more preferably 80% or more at a wavelength of 500 nm.

The first electrode 4 preferably includes a non-porous electric conductor. The first electrode 4 is also preferably in the form of a film or a layer.

The first electrode 4 is stacked on the first substrate 7. The first electrode 4 includes, for example, a metal such as platinum, gold, silver, copper, aluminum, rhodium, and indium; carbon; an electrically conductive metal oxide such as an indium-tin composite oxide, tin oxide doped with antimony, and tin oxide doped with fluorine; a composite of the metals or the compounds; and a material obtained by applying, for example, silicon oxide, tin oxide, titanium oxide, zirconium oxide, or aluminum oxide onto the metal or the compound. The first electrode 4 preferably has a lower surface resistance and the surface resistance is preferably 200 Ω/sq. or less and more preferably 50 Ω/sq. or less. The lower limit of the surface resistance is not particularly limited and is typically 0.1 Ω/sq.

The first electrode 4 preferably has a thickness ranging from 0.1 to 10 μm. A thickness within the range enables easy formation of the first electrode 4 having a uniform thickness and also suppresses the reduction in the light transmittance of the first electrode 4. This allows sufficient light to enter an optical device through the first electrode 4 or to exit from an optical device through the first electrode 4.

The first electrode 4 can be produced by an appropriate method. Examples of the method for producing the first electrode 4 include vacuum processes such as sputtering and depositing; and wet processes such as spin coating, spraying, and screen printing.

The conductive particle layer 20 is a porous layer including conductive particles 30 as conceptually shown in FIG. 1. The conductive particle layer 20 has a three-dimensional porous network structure that is formed by interconnection of the conductive particles 30. In the three-dimensional network structure, particles adjacent to each other are joined to form the interconnection of the conductive particles 30. The three-dimensional network structure is further joined to the first electrode 4. In other words, particles in the three-dimensional network structure and in contact with the first electrode 4 are joined to the first electrode 4. Such a conductive particle layer 20 may be a sintered compact of the conductive particles 30.

The conductive particles 30 included in the conductive particle layer 20 contain at least acicular particles 31.

The conductive particle layer 20 contains pores having a pore size of 50 nm or more in a total volume of 50% or more based on the volume of all pores in the conductive particle layer 20.

In the conductive particle layer 20 having such a structure, a plurality of the conductive particles 30 form an electron route (route through which electrons can pass) and the routes are connected to the first electrode 4. On this account, in a photoelectric element 40 including an electron transport layer 1 that is formed in the pores in the conductive particle layer 20, the conductive particles 30 improve electron transport properties between the first electrode 4 and the electron transport layer 1.

In addition, the conductive particle layer 20 having a porous structure obtains a high specific surface area. This can increase the reaction interface of the photoelectric element 40 when the electron transport layer 1 is formed in the pores in the conductive particle layer 20.

The conductive particles 30 included in the conductive particle layer 20 will be described in further detail.

The conductive particles 30 preferably have both optical transparency and electrical conductivity. The conductive particles 30 preferably have a volume resistivity of $10^7$ Ω/cm or less, more preferably $10^5$ Ω/cm or less, and particularly preferably 10 Ω/cm or less. The lower limit of the volume resistivity is not particularly limited and is typically about $10^{-9}$ Ω/cm. The resistivity of the conductive particles 30 is not necessarily limited but is preferably substantially the same as the resistivity of the first electrode 4.

The shape features of the conductive particles 30 will be described. The conductive particles 30 contain the acicular particles 31 as described above. This further reduces the packing density of the conductive particles 30. In other words, voids are readily formed among the conductive particles 30 and the voids are likely to have a large volume. This further increases the void ratio in the conductive particle layer 20. In the present embodiment, the acicular particles 31 mean particles having a ratio of major axis length/minor axis length of 10 or more.

The acicular particles 31 preferably have an average major axis length of 100 to 1,000 nm. Such acicular particles allow the conductive particle layer 20 to have a particularly high specific surface area. The acicular particles 31 more preferably have an average major axis length ranging from 100 to 200 nm.

The acicular particles 31 also preferably have a major axis length of 3,000 nm or less. Such acicular particles allow the conductive particle layer 20 to have particularly high transparency and to be unlikely to have a large surface roughness. This makes the conductive particle layer 20 be particularly suitable for a component constituting a photoelectric element. In particular, the particles having a major axis length of 3,000 nm or less are preferably contained in a ratio of 80% or more based on the total amount of the acicular particles 31. It is more preferred that the whole acicular particles 31 have a major axis length of 3,000 nm or less.

The average minor axis length of the acicular particles 31 is not particularly limited and is preferably 100 nm or less. Such acicular particles particularly increase the specific surface area and void ratio of the conductive particle layer 20. The lower limit of the average minor axis length is not particularly specified but the average minor axis length is preferably 1 nm or more in order that the acicular particles 31 have sufficient strength and good dispersibility. The acicular particles 31 more preferably have an average minor axis length ranging from 10 to 30 nm.

The major axis length and the minor axis length of the acicular particles 31 can be determined from observation results of images under an electron microscope such as SEM. In the image of an acicular particle 31, the longest size is regarded as the major axis length and the shortest size is regarded as the minor axis length. The average major axis length and the average minor axis length of the acicular particles 31 are arithmetic mean values of the measurement results (30 particles are subjected to the measurement) of the major axis length and the minor axis length of the acicular particles 31, respectively.

The acicular particles 31 preferably have a ratio of average major axis length/average minor axis length of 10 or more. Such acicular particles 31 obtain a larger specific surface area, and this improves the electron transport properties between the acicular particles 31 and the electron transport layer 1, thereby further improving the electron transport properties between the first electrode 4 and the electron transport layer 1. The acicular particles 31 more preferably have a ratio of average major axis length/average minor axis length of 20 or more and even more preferably 30 or more. The upper limit of the ratio of average major axis length/average minor axis of the acicular particles 31 is not particularly limited, but considering that the average major axis length preferably ranges from 100 to 1,000 nm, the ratio of average major axis length/average minor axis length is preferably 100 or less.

The acicular particles 31 are preferably contained in a ratio ranging from 10 to 100% by mass, more preferably from 10 to 95% by mass, and particularly preferably from 50 to 80% by mass, based on the total amount of the conductive particles 30. In such a case, the acicular particles 31 makes the conductive particle layer 20 be a structure having a high void ratio and the conductive particle layer 20 consequently has both high electric conductivity and a high void ratio.

The conductive particles 30 preferably contain, together with the acicular particles 31, spherical particles 32 having an average particle size of 100 nm or less. In the present embodiment, the spherical particles 32 mean particles having a ratio of major axis length/minor axis length of 3 or less. Conductive particles 30 containing the spherical particles 32 form a structure including the spherical particle 32 interposed between the acicular particles 31 in the conductive particle layer 20. This forms, in the conductive particle layer 20, a structure in which two acicular particles 31 are connected through a spherical particle 32. This improves the binding properties between particles to thus increase the strength of the conductive particle layer 20. This also improves current-carrying properties between particles, thereby further improving the electron transport properties between the electron transport layer 1 and the first electrode 4. Mixing the acicular particles 31 and the spherical particles 32 as the conductive particles 30 increases the size of pores in the conductive particle layer 20. This can increase the ratio of pores, for example, having a pore size of 50 nm or more, compared to the structure containing the acicular particles 31 alone. On this account, pores in the conductive particle layer 20 are more readily filled with the electron transport layer 1. In addition, for a conductive particle layer 20 capable of being filled with an equal amount of an electron transport layer 1, such a structure reduces the total amount of the conductive particles 30 required. In other words, such a structure can reduce the density of the conductive particles 30 in the conductive particle layer 20. This can also improve transparency of the conductive particle layer 20.

The spherical particles 32 preferably have an average particle size of 100 nm or less as described above. The spherical particles 32 having such a size readily cause aggregation and thus the spherical particles 32 are readily in contact between the acicular particles 31 with good adhesion. This particularly improves electric conductivity of the conductive particle layer 20. The average particle size is more preferably 50 nm or less. The lower limit of the average particle size of the spherical particles 32 is not particularly limited and the average particle size is preferably 1 nm or more and more preferably 5 nm or more in order to suppress excess aggregation of the spherical particles 32 to improve handling properties. The average particle size also preferably ranges from 10 to 30 nm.

The average particle size of the spherical particles 32 is a value determined by dynamic light scattering (DLS) using methyl ethyl ketone (MEK) as a dispersion solvent. Usable examples of the measurement apparatus include Fiber-Optics Particle Analyzer (FPAR-1000) manufactured by Otsuka Electronics Co., Ltd.

The spherical particles 32 are preferably contained in a ratio of 90% by mass or less based on the total amount of the conductive particles 30. This allows the spherical particles 32 to exert adhesiveness between the acicular particles 31. The spherical particles 32 are more preferably contained in a ratio of 50% by mass or less and even more preferably 30% by mass or less. In particular, the spherical particles 32 are preferably contained in a ratio ranging from 5 to 90% by mass, more preferably from 20 to 50% by mass, and even more preferably 20 to 30% by mass. In order to increase the size of pores in the conductive particle layer 20 to further increase the ratio of pores having a pore size of 50 nm or more, the spherical particles 32 are preferably contained in a ratio of 80% by mass or less and more preferably 20 to 60% by weight.

The material features of the conductive particles 30 will be described. Specific examples of the material for the conductive particles 30 include indium-tin oxide (ITO), tin oxide, zinc oxide, antimony trioxide, silver, gold, copper, carbon nanotubes, and graphite. The conductive particles 30 may contain particles (for example, Passtran manufactured by MITSUI MINING & SMELTING CO., LTD.) that include a core material including, for example, barium sulfate or aluminum borate and a coating including, for example, tin oxide, tin oxide doped, and ITO. The conductive particles 30 may further contain metal particles as long as the conductive particle layer 20 keeps optical transparency.

The conductive particles 30 preferably have excellent optical transparency. In particular, the conductive particles 30 preferably include a semiconductor material obtained by doping an n-type semiconductor having a band gap of 3 eV or more with another element (dopant). Conductive particles 30 including a material having a band gap of 3 eV or more have no absorption of visible light. In addition, a semiconductor material doped with a dopant obtains a higher carrier density, a lower resistance value, and electric conductivity. Specific examples of such a semiconductor material include materials obtained by doping, for example, tin oxide, zinc oxide, titanium oxide, and indium oxide with a dopant, such as tin-doped indium oxide (ITO), fluorine-doped tin oxide (FTO), antimony-doped tin oxide (ATO), aluminum-doped zinc oxide (AZO), gallium-doped zinc oxide (GZO), and antimony-doped zinc oxide (AZO).

In particular, at least some of the conductive particles 30 preferably contain at least one of tin oxide and zinc oxide. In other words, the conductive particles 30 preferably include particles containing at least one of tin oxide and zinc oxide. Particles containing tin oxide and particles containing zinc oxide have high electric conductivity and high transparency, and this improves the transparency of the conductive particle layer 20 and further improves the electron transport properties between the first electrode 4 and the electron transport layer 1. The particles containing tin oxide and the particles containing zinc oxide are preferably contained in a total ratio of 50% by mass or more, more preferably 80% by mass or more, and particularly preferably 95% by mass or more, based on the total amount of the conductive particles 30. In other words, the particles containing at least one of tin oxide and zinc oxide are preferably contained in a ratio of 50% by mass or more, more preferably 80% by mass or more, and particularly preferably 95% by mass or more, based on the total amount of the conductive particles 30.

The conductive particles 30 may contain both tin oxide and zinc oxide in any ratio and the mass ratio of tin oxide:zinc oxide preferably ranges from 0.1:10 to 10:0.1.

At least some of the conductive particles 30 preferably contain at least one of tin oxide that is doped with at least one of antimony, fluorine, and indium and of zinc oxide that is doped with at least one of aluminum, gallium, and indium. In other words, the conductive particles 30 preferably include particles containing at least one of tin oxide that is doped with at least one of antimony, fluorine, and indium and of zinc oxide that is doped with at least one of aluminum, gallium, and indium. Particles containing tin oxide that is doped with at least one of antimony, fluorine, and indium and particles containing zinc oxide that is doped with at least one of aluminum, gallium, and indium have high electric conductivity, high transparency, and high heat resistance. This improves the transparency and heat resistance of the conductive particle layer 20 and further improves the electron transport properties between the first electrode 4 and the electron transport layer 1.

Specific examples of the tin oxide doped with at least one of antimony, fluorine, and indium include antimony-tin oxide (ATO) and indium-tin oxide (ITO).

A tin oxide doped with a pentavalent positive ion, such as tantalum-doped tin oxide and niobium-doped tin oxide may also be used.

Specific examples of the zinc oxide doped with at least one of aluminum, gallium, and indium include aluminum-doped zinc oxide, gallium-doped zinc oxide, and indium-doped zinc oxide.

The total ratio of the particles containing tin oxide doped with at least one of antimony, fluorine, and indium and the particles containing zinc oxide doped with at least one of aluminum, gallium, and indium is not particularly limited and is preferably 50% by mass or more, more preferably 80% by mass or more, and particularly preferably 95% by mass or more, based on the total amount of the conductive particles 30. In other words, the ratio of the particles containing at least one of tin oxide that is doped with at least one of antimony, fluorine, and indium and of zinc oxide that is doped with at least one of aluminum, gallium, and indium is preferably 50% by mass or more, more preferably 80% by mass or more, and particularly preferably 95% by mass or more, based on the total amount of the conductive particles 30.

The conductive particle layer 20 contains pores having a pore size (pore diameter) of 50 nm or more in a total volume of 50% or more based on the volume of all pores in the conductive particle layer 20 as described above. This allows pores in the conductive particle layer 20 to be more readily filled with the electron transport layer 1. The ratio of the total volume of pores having a pore diameter of 50 nm or more with respect to the volume of all pores can be calculated from the pore distribution determined by mercury intrusion method.

The conductive particle layer 20 preferably contains pores having a pore diameter of 100 nm or more in a total volume of 50% or more based on the volume of all pores in the conductive particle layer 20. In this case, pores in the conductive particle layer 20 are more readily filled with the electron transport layer 1. The ratio of the total volume of pores having a pore diameter of 100 nm or more with respect to the volume of all pores can also be calculated from the pore distribution determined by mercury intrusion method.

The average pore size of pores in the conductive particle layer 20 is not particularly limited but is, for example, preferably 20 nm or more, more preferably 50 nm or more, and even more preferably 100 nm or more.

The conductive particle layer 20 also preferably has a void ratio (ratio of volume of all pores in the conductive particle layer 20 with respect to apparent volume of the conductive particle layer 20) of 50% or more and 95% or less. Pores in such a conductive particle layer 20 are filled with the electron transport layer 1 in a sufficiently large amount and this further improves the electron transport properties between the first electrode 4 and the electron transport layer 1. In addition, such a structure allows pores in the conductive particle layer 20 to obtain a sufficiently large area (reaction interface) for charge coupling or charge separation and this increases the conversion efficiency of a photoelectric element 40.

The conductive particle layer 20 preferably has a thickness of 100 nm or more. In such a case, the conductive particle layer 20 obtains a larger roughness factor. This further improves the electron transport properties between the electron transport layer 1 and the conductive particles 30 and suppresses a side reaction on the surface of the conductive particle layer 20. Accordingly, the conversion efficiency of a photoelectric element 40 is further improved. The roughness factor of the conductive particle layer 20 means the ratio of an actual surface area of the conductive particle layer 20 with respect to a projected area in the thickness direction of the conductive particle layer 20. The actual surface area of the conductive particle layer 20 is the total surface area of the all conductive particles 30 included in the conductive particle layer 20. The actual surface area of the conductive particle layer 20 may be determined by nitrogen adsorption method when it fails to be determined from the shape of the conductive particles 30. The conductive particle layer 20 more preferably has a thickness of 1,000 nm or more. The thickness of the conductive particle layer 20 is not particularly limited but the thickness is preferably 1 mm or less in order to increase light transmittance of the conductive particle layer 20.

The conductive particle layer 20 preferably has a roughness factor of 5 or more and 2,000 or less. Such a structure further improves the electron transport properties between the electron transport layer 1 and the conductive particles 30 and suppresses a side reaction on the surface of the conductive particle layer 20. Accordingly, the conversion efficiency of a photoelectric element 40 is further improved.

The conductive particle layer 20 is formed of, for example, a sintered compact of the conductive particles 30. The conductive particle layer 20 formed of the sintered compact of the conductive particles 30 is produced by the method below, for example. First, the conductive particles 30, an organic binder, and an organic solvent are mixed to prepare a dispersion solution. The composition of the conductive particles 30 contained in the dispersion solution is the same as the composition of the conductive particles 30 in the conductive particle layer 20. Applying the dispersion solution onto the first electrode 4 forms a wet coating. The applying can be performed by an appropriate means such as spin coating, spraying, and screen printing. Burning the wet coating volatilizes the organic binder and the organic solvent and sinters the conductive particles 30. This connects particles adjacent to each other among the conductive particles 30 and connects the first electrode 4 to particles in contact with the first electrode 4. Accordingly, the conductive particle layer 20 is produced.

Examples of the factor affecting the ratio of the total volume of pores having a pore size of 50 nm or more or pores having a pore size of 100 nm or more with respect to the volume of all pores in the conductive particle layer 20 and the factor affecting the void ratio of the conductive particle layer 20 include each ratio of the conductive particles 30, the organic binder, and the organic solvent in the dispersion solution, the size of the acicular particles 31 in the conductive particles 30, the size of the spherical particles 32 in the conductive particles 30, and each ratio of the acicular particles 31 and the spherical particles 32 with respect to the total amount of the conductive particles 30. For example, mixing the spherical particles 32 in the conductive particles 30 or increasing the ratio of the spherical particles 32 in the conductive particles 30 can increase the ratio of the total volume of pores having a pore size of 50 nm or more or pores having a pore size of 100 nm or more with respect to the volume of all pores in the conductive particle layer 20. However, an excess ratio of the spherical particles 32 conversely reduces the ratio of the total volume of pores having a pore size of 50 nm or more or pores having a pore size of 100 nm or more with respect to the volume of all pores in the conductive particle layer 20. On this account, the ratio of the total volume of pores having a pore size of 50 nm or more or pores having a pore size of 100 nm or more is controlled by appropriately adjusting the ratio of the spherical particles 32. In addition, increasing the ratio of the organic binder with respect to the conductive particles 32 can increase the void ratio of the conductive particle layer 20, and reducing the ratio of the organic binder can reduce the void ratio. Appropriately adjusting the conditions allows the ratio of the total volume of pores having a pore size of 50 nm or more or pores having a pore size of 100 nm or more to become an intended value with respect to the volume of all pores in the conductive particle layer 20 or can produce the conductive particle layer 20 having an intended void ratio.

A photoelectric element 40 of the present embodiment includes the electrode composite 10, a second electrode 6, an electron transport layer 1, a hole transport layer 5, and an electrolytic solution. The photoelectric element 40 of the present embodiment further includes a second substrate 8.

The second electrode 6 is arranged opposite to the conductive particle layer 20 of the electrode composite 10. The electron transport layer 1 and the hole transport layer 5 are interposed between the first electrode 4 of the electrode composite 10 and the second electrode 6. The electron transport layer 1 includes an organic compound having a redox moiety capable of repeated oxidation-reduction, and the organic compound and the electrolytic solution form a gel layer 2. In other words, the organic compound is impregnated with the electrolytic solution to be swollen, and therefore a gelled layer (gel layer 2) is formed, in which the organic compound constituting the electron transport layer 1 and the electrolytic solution are mixed. At least some of the gel layer 2 is filled in the pores in the conductive particle layer 20 of the electrode composite 10. The whole gel layer 2 may be filled in the pores in the conductive particle layer 20 of the electrode composite 10.

Forming the gel layer 2 from the organic compound of the electron transport layer 1 and the electrolytic solution in this manner enlarges a reaction interface. In addition, filling at least some of the gel layer 2 in the pores in the conductive particle layer 20 improves the electron transport properties between the electron transport layer 1 and the conductive particles 30, thereby increasing the electron transport properties between the electron transport layer 1 and the first electrode 4. Accordingly, the photoelectric element 40 obtains higher conversion efficiency from light to electricity or higher conversion efficiency from electricity to light.

The photoelectric element 40 of the present embodiment will be described in further detail.

Figure 3:
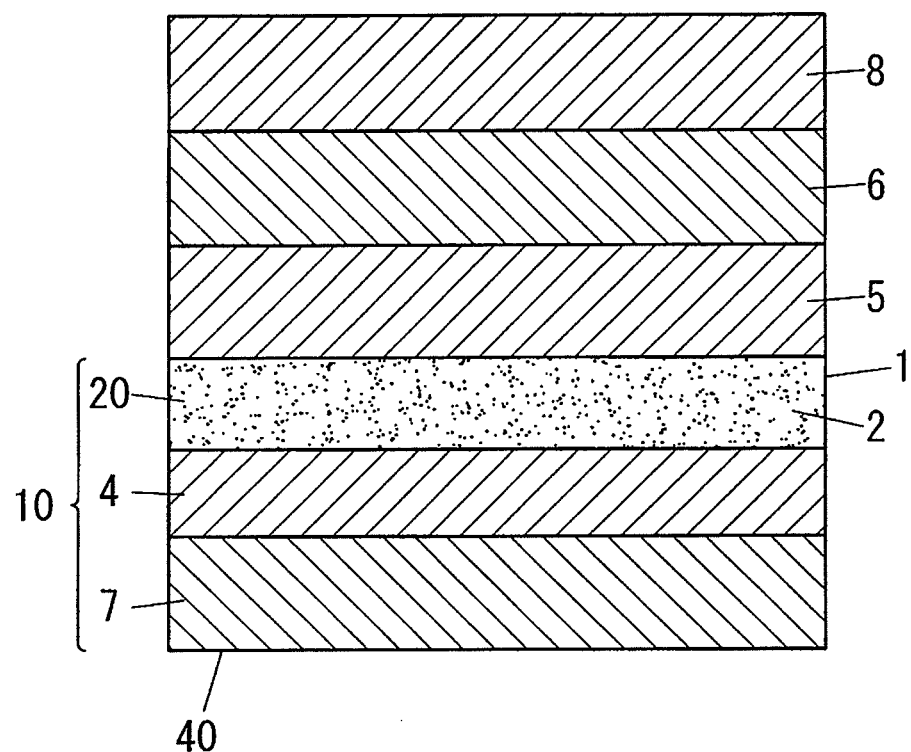
FIG. 3 is a schematic cross-sectional view showing a photoelectric element in an embodiment of the present invention.

FIG. 3 shows an example of the photoelectric element 40 of the present embodiment. In the photoelectric element 40, a second substrate 8 is arranged opposite to the conductive particle layer 20 of the electrode composite 10. On this account, the first substrate 7 of the electrode composite 10 and the second substrate 8 are arranged to face each other. On the surface of the second substrate 8, a second electrode 6 is arranged while facing the electrode composite 10. On this account, the first electrode 4 and the second substrate 8 are opposite to each other, and on the surface of the first electrode 4, the conductive particle layer 20 is arranged while facing the second electrode 6. The second electrode 6 and the conductive particle layer 20 stand apart from each other.

Between the electrode composite 10 and the second electrode 6, an electron transport layer 1 and a hole transport layer 5 are interposed. The electron transport layer 1 is arranged on the side of the electrode composite 10 and the hole transport layer 5 is arranged on the side of the second electrode 6.

In the present embodiment, in the pores in the conductive particle layer 20, the organic compound is disposed, and the electron transport layer 1 is accordingly formed in the pores in the conductive particle layer 20. In addition, between the first electrode 4 and the second electrode 6, the electrolytic solution is disposed, which constitutes the hole transport layer 5. The electrolytic solution is also filled in the pores in the conductive particle layer 20, and in the pores, the organic compound is impregnated with the electrolytic solution to be swollen. On this account, in the pores, the organic compound and the electrolytic solution form a gel layer 2, and in the gel layer 2, an interface of the electron transport layer 1 and the hole transport layer 5 is formed. In other words, the electrolytic solution constituting the gel layer 2 constitutes some of the hole transport layer 5.

The second substrate 8 has insulating properties. The second substrate 8 may be optically transparent or not. The second substrate 8 that is required to transmit light preferably has a high light transmittance. In such a case, the second substrate 8 preferably has a light transmittance of 50% or more and more preferably 80% or more at a wavelength of 500 nm. The second substrate 8 can be formed of, for example, glass or an optically transparent film.

The second electrode 6 can serve as the positive electrode of the photoelectric element 40. The second electrode 6 is produced by stacking an electrically conductive material on the second substrate 8, for example. The material for the second electrode 6 depends on the type of a photoelectric element 40 and examples include metals such as platinum, gold, silver, copper, aluminum, rhodium, and indium; carbon materials such as graphite, carbon nanotubes, platinum supported on carbon; electrically conductive metal oxides such as an indium-tin composite oxide, antimony-doped tin oxide, and fluorine-doped tin oxide; and electrically conductive polymers such as polyethylenedioxythiophene, polypyrrole, and polyaniline.

The second electrode 6 can be produced by an appropriate method. Examples of the means for producing the second electrode 6 include vacuum processes such as sputtering and depositing; and wet processes such as spin coating, spraying, and screen printing.

The molecule of the organic compound constituting the electron transport layer 1 has a redox moiety capable of repeated oxidation-reduction and also has a moiety (hereinafter also called gel moiety) that forms a gel by containing an electrolytic solution to be swollen. The redox moiety is chemically bonded to the gel moiety. The positional relation between the redox moiety and the gel moiety in the molecule is not particularly limited. For example, in a molecule having the gel moiety that constitutes a molecular framework such as a main chain, the redox moiety is a side chain that is bonded to the main chain. A molecular framework forming the gel moiety may be alternately bonded to a molecular framework forming the redox moiety. In such a case in which both the redox moiety and the gel moiety are present in the same molecule, the gel layer 2 can support the redox moiety so as to remain at a position at which the redox moiety readily transport electrons.

The organic compound constituting the electron transport layer 1 may have a low molecular weight or a high molecular weight. A usable organic compound having a low molecular weight may be an organic compound that forms what is called a low molecular weight gel through a hydrogen bond and other factors. The organic compound having a high molecular weight, specifically having a number average molecular weight of 1,000 or more, is preferred because such an organic compound spontaneously forms a gel. The upper limit of the molecular weight of the organic compound having a high molecular weight is not particularly limited and is preferably 1,000,000 or less. The gel layer 2 is a layer in a gel form, and preferred examples of the external appearance include, but are not necessarily limited to, a konjac jelly form and an ion exchange film form.

The redox moiety means a site that is reversibly converted into an oxidized form and a reduced form by oxidation-reduction reaction. The redox moiety may be a site that constitutes a pair of oxidation-reduction system including an oxidized form and a reduced form and is not particularly limited. The oxidized form and the reduced form preferably have the same charge.

A physical index affecting the size of the reaction interface in the gel layer 2 is the degree of swelling. As used herein, the degree of swelling is represented by the equation below.

Degree of swelling=(weight of gel)/(weight of dried gel)×100

The dried gel is obtained by drying the gel layer 2. The drying the gel layer 2 means removing an electrolytic solution contained in the gel layer 2. Examples of the method for drying the gel layer 2 include a method by heating, a method of removing an electrolytic solution in a vacuum environment, and a method of removing an electrolytic solution contained in the gel layer 2 by using other solvents.

For the removal of an electrolytic solution contained in the gel layer 2 by using other solvents, selecting a solvent that has high affinity to the electrolytic solution contained in the gel layer 2 or that can be removed by further heating or in a vacuum environment causes the electrolytic solution contained in the gel layer 2 to be efficiently removed.

The gel layer 2 preferably has a degree of swelling of 110 to 3,000% and more preferably 150 to 500%. A gel layer 2 having a degree of swelling of 110% or more can contain an electrolyte component in a sufficient amount and this sufficiently stabilizes the redox moiety. A gel layer 2 having a degree of swelling of 3,000% or less can contain the redox moiety in a sufficient amount and this increases the electron transport properties between the electron transport layer 1 and the first electrode 4.

The organic compound having the redox moiety and the gel moiety in the same molecule can be represented by the general formula below.

$(Xi)_n$ represents the gel moiety and Xi represents a monomer of a compound constituting the gel moiety. The gel moiety can be formed of a polymer framework. The degree n of polymerization of a monomer preferably ranges from 1 to 100,000. Y represents the redox moiety bonded to $(Xi)_n$. j and k are arbitrary integers representing the numbers of $(Xi)_n$ and Y in a molecule, respectively, and each preferably ranges from 1 to 100,000. The redox moiety Y may be bonded to any site in the polymer framework constituting the gel moiety $(Xi)_n$. The redox moiety Y may contain various moieties, and such moieties preferably have similar oxidation-reduction potentials from the viewpoint of electron exchange reaction.

Examples of such an organic compound having the redox moiety Y and the gel moiety $(Xi)_n$ in the same molecule include a polymer having a quinone derivative framework formed of chemically bonded quinones, a polymer having an imide derivative framework containing imides, a polymer having a phenoxyl derivative framework containing phenoxyls, and a polymer having a viologen derivative framework containing viologens. In these organic compounds, the polymer framework serves as the gel moiety and each of the quinone derivative framework, the imide derivative framework, the phenoxyl derivative framework, and the viologen derivative framework serves as the redox moiety.

Among the organic compounds, examples of the polymer having a quinone derivative framework formed of chemically bonded quinones include polymers having chemical structures of [Chemical Formula 1] to [Chemical Formula 4]. In [Chemical Formula 1] to [Chemical Formula 4], each of "R"s is saturated or unsaturated hydrocarbons such as methylene, ethylene, propane-1,3-dienyl, ethylidene, propane-2,2-diyl, alkanediyl, benzylidene, propylene, vinylidene, propene-1,3-diyl, and but-1-ene-1,4-diyl; cyclic hydrocarbons such as cyclohexanediyl, cyclohexenediyl, cyclohexadienediyl, phenylene, naphthalene, and biphenylene; keto and divalent acyl groups such as oxalyl, malonyl, succinyl, glutaryl, adipoyl, alkanedioyl, sebacoyl, fumaroyl, maleoyl, phthaloyl, isophthaloyl, and terephthaloyl; ethers and esters such as oxy, oxymethylenoxy, and oxycarbonyl; sulfur-containing groups such as sulfanediyl, sulfanil, and sulfonyl; nitrogen-containing groups such as imino, nitrilo, hydrazo, azo, azino, diazoamino, urylene, and amide; silicon-containing groups such as silanediyl and disilane-1,2-diyl; or groups formed by substituting the terminal thereof and composite groups thereof. [Chemical Formula 1] is an example of the organic compound including a polymer main chain to which an anthraquinone is chemically bonded. [Chemical Formula 2] is an example of the organic compound including a polymer main chain into which an anthraquinone is integrated as a repeated unit. [Chemical Formula 3] is an example of the organic compound including an anthraquinone as a cross-linking unit. [Chemical Formula 4] is an example of the anthraquinone having a proton donating group that forms an intermolecular hydrogen bond together with an oxygen atom.

[Chemical Formula 1]

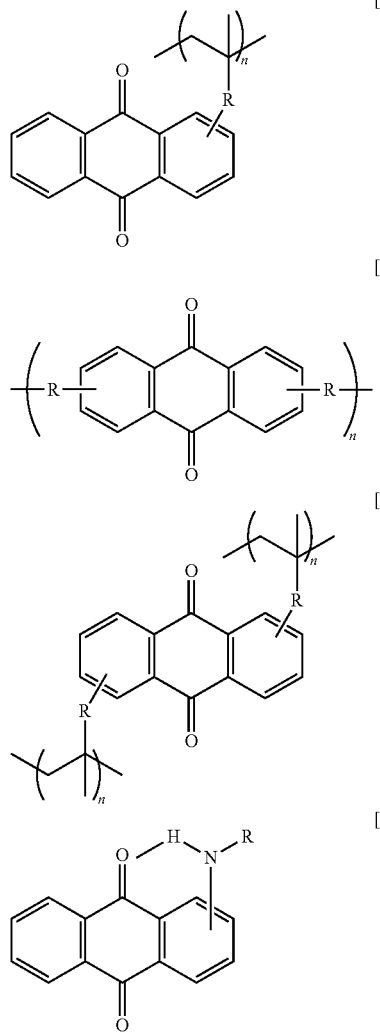

[Chemical Formula 2]

[Chemical Formula 3]

[Chemical Formula 4]

[Chemical Formula 5]

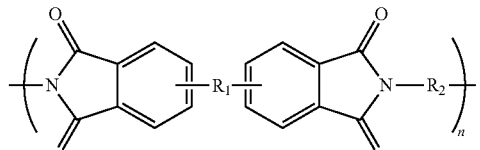

[Chemical Formula 6]

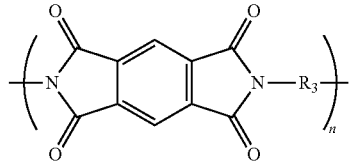

Examples of the polymer having a phenoxyl derivative framework containing phenoxyls include a galvi compound (galvi polymer) as represented by [Chemical Formula 7]. In the galvi compound, the galvinoxyl group (see [Chemical Formula 8]) corresponds to the redox moiety Y, and the polymer framework corresponds to the gel moiety $(Xi)_n$.

[Chemical Formula 7]

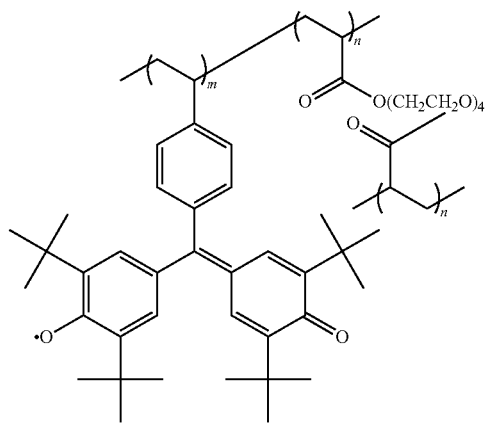

[Chemical Formula 8]

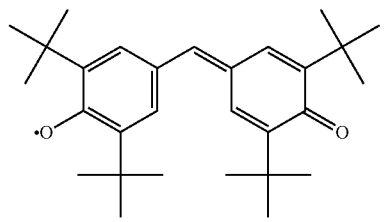

The quinone polymer can undergo high speed redox reaction in which the rate is not determined by proton transfer, has no electronic interaction with a quinone group as the redox site (redox moiety), and has chemical stability to be usable for a long period of time. In addition, the quinone polymer fails to be dissolved in an electrolytic solution and thus has an advantage because supporting the quinone polymer on the first electrode 4 enables the formation of the electron transport layer 1.

Examples of the polymer having an imide derivative framework containing imides include polyimides represented by [Chemical Formula 5] and [Chemical Formula 6]. In [Chemical Formula 5] and [Chemical Formula 6], each of $R_1$ to $R_3$ is an aromatic group such as a phenylene group, an aliphatic chain such as an alkylene group and an alkyl ether, or an ether group. The polyimide polymer framework may be cross-linked at the sites of $R_1$ to $R_3$ but may have no cross-linked structure as long as the polyimide polymer framework is merely swollen in a solvent and is not dissolved. In a cross-linked polymer, the cross-linked moiety corresponds to the gel moiety $(Xi)_n$. In a polyimide polymer framework with a cross-linked structure, the cross-linking unit may contain an imido group. A suitably used imido group is exemplified by phthalimide and pyromellitimide having electrochemically reversible oxidation-reduction properties.

Examples of the polymer having a viologen derivative framework containing viologens include polyviologen polymers as represented by [Chemical Formula 9] and [Chemical Formula 10]. In the polyviologen polymer, the moiety represented by [Chemical Formula 11] corresponds to the redox moiety Y, and the polymer framework corresponds to the gel moiety $(Xi)_n$.

[Chemical Formula 9]

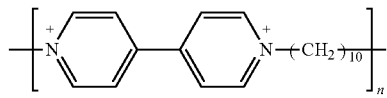

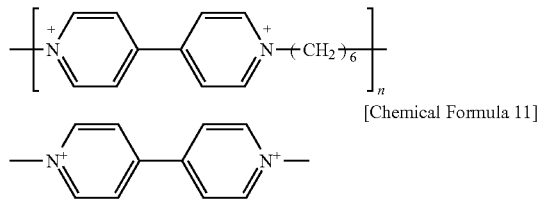

[Chemical Formula 10]

[Chemical Formula 11]

In [Chemical Formula 1] to [Chemical Formula 3], [Chemical Formula 5] to [Chemical Formula 7], [Chemical Formula 9], and [Chemical Formula 10], each of "m" and "n"s is the degree of polymerization of a monomer, and the value preferably ranges from 1 to 100,000.

As described above, a space in the polymer framework of the organic compound having the redox moiety and the gel moiety as the polymer framework contains an electrolytic solution, and then the polymer is swollen to form a gel layer 2. The electron transport layer 1 including the organic compound contains an electrolytic solution in this manner, and this compensates an ionic state formed by oxidation-reduction reaction of the redox moiety with a counter ion in the electrolytic solution, thereby stabilizing the redox moiety.

The electrolytic solution may contain an electrolyte and a solvent. The electrolyte is, for example, one or both of a supporting salt and an oxidation-reduction component including an oxidized form and a reduced form. Examples of the supporting salt (supporting electrolyte) include ammonium salts such as tetrabutylammonium perchlorate, tetraethylammonium hexafluorophosphate, an imidazolium salt, and a pyridinium salt; and alkali metal salts such as lithium perchlorate and potassium tetrafluoroborate. The oxidation-reduction component means a pair of substances reversibly converted into an oxidized form and a reduced form by oxidation-reduction reaction. Examples of such an oxidation-reduction component include, but are not limited to, a chlorine compound/chlorine, an iodine compound/iodine, a bromine compound/bromine, a thallium ion (III)/a thallium ion (I), a mercury ion (II)/a mercury ion (I), a ruthenium ion (III)/a ruthenium ion (II), a copper ion (II)/a copper ion (I), an iron ion (III)/an iron ion (II), a nickel ion (II)/a nickel ion (III), a vanadium ion (III)/a vanadium ion (II), and a manganate ion/a permanganate ion. These oxidation-reduction components serve independent of the redox moiety in the electron transport layer 1. The electrolytic solution may be in a gel form or in an immobilized form.

The solvent included in the electrolytic solution contains at least one of water, organic solvents, and ionic liquids.

Using water or an organic solvent as a solvent in the electrolytic solution stabilizes a reduction state of the redox moiety of the organic compound, and this enables more stable transportation of electrons. The solvent to be used may be water or an organic solvent and is preferably an organic solvent having excellent ionic conductivity in order to further stabilize the redox moiety. Examples of such an organic solvent include carbonate compounds such as dimethyl carbonate, diethyl carbonate, methyl ethyl carbonate, ethylene carbonate, and propylene carbonate; ester compounds such as methyl acetate, methyl propionate, and γ-butyrolactone; ether compounds such as diethyl ether, 1,2-dimethoxyethane, 1,3-dioxolane, tetrahydrofuran, and 2-methyl-tetrahydrofuran; heterocyclic compounds such as 3-methyl-2-oxazolidinone and 2-methylpyrrolidone; nitrile compounds such as acetonitrile, methoxyacetonitrile, and propionitrile; and aprotic polar compounds such as sulfolane, dimethylsulfoxide, and dimethylformamide. These solvents may be used singly or in combination as a mixture of two or more of them. Among them, in order to use the photoelectric element 40 as a photoelectric conversion element and to improve power output characteristics of the element, carbonate compounds such as ethylene carbonate and propylene carbonate; heterocyclic compounds such as γ-butyrolactone, 3-methyl-2-oxazolidinone, and 2-methylpyrrolidone; and nitrile compounds such as acetonitrile, methoxyacetonitrile, propionitrile, 3-methoxypropionitrile, and valeronitrile are preferred.

Using an ionic liquid as a solvent in the electrolytic solution stabilizes the redox moiety. In addition, an ionic liquid, which has no volatility and has high flame retardancy, is excellent in stability. As the ionic liquid, known ionic liquids can be used without limitation and examples include an imidazolium ionic liquid such as 1-ethyl-3-methylimidazolium tetracyanoborate, a pyridine ionic liquid, an alicyclic amine ionic liquid, an aliphatic amine ionic liquid, an azonium amine ionic liquid, and ionic liquids described in European Patent No. 718288, specification; International Publication WO 95/18456, pamphlet; Denkikagaku, Vol. 65, No. 11, p. 923 (1997); J. Electrochem. Soc., Vol. 143, No. 10, p. 3099 (1996); and Inorg. Chem., Vol. 35, p. 1168 (1996).

The gel layer 2 formed from the organic compound having the redox moiety and the electrolytic solution as above is filled in the pores in the conductive particle layer 20, thereby forming the electron transport layer 1 in the pores. In the electron transport layer 1 formed in this manner, electrons serve as a dopant. For example, the electron transport layer 1 has a redox moiety having an oxidation-reduction potential higher than +100 mV with respect to a silver/silver chloride reference electrode.

The photoelectric element 40 may include a sensitizing dye that efficiently absorbs visible light or near infrared light and that is in contact with the electron transport layer 1 and on the interface between the electron transport layer 1 and the hole transport layer 5. The organic compound having a redox moiety in the electron transport layer 1 is swollen with the electrolytic solution to form the gel layer 2. The hole transport layer 5 also includes the same electrolytic solution. Thus, the electrolytic solution contained in the gel layer 2 also constitutes some of the hole transport layer 5. Thus, attaching, adsorbing, or bonding the sensitizing dye onto the surface of the organic compound constituting the electron transport layer 1 allows the sensitizing dye to be present in the gel layer 2, and the sensitizing dye is accordingly provided on the interface between the electron transport layer 1 and the hole transport layer 5. The photoelectric element 40 including the sensitizing dye as above serves as a photoelectric conversion element (dye sensitized photoelectric conversion element).

The sensitizing dye may be known materials. Specific examples of the sensitizing dye include a 9-phenylxanthene dye, a coumarin dye, an acridine dye, a triphenylmethane dye, a tetraphenylmethane dye, a quinone dye, an azo dye, an indigo dye, a cyanine dye, a merocyanine dye, and a xanthene dye. Examples of the sensitizing dye further include a $RuL_2(H_2O)_2$ type ruthenium-cis-diaqua-bipyridyl complex (where L is 4,4'-dicarboxyl-2,2'-bipyridine); transition-metal complexes such as ruthenium-tris ($RuL_3$), ruthenium-bis($RuL_2$), osmium-tris ($OsL_3$), and osmium-bis($OsL_2$); zinc-tetra(4-carboxyphenyl)porphyrin; an iron-hexacyanide complex; and phthalocyanine. Other applicable examples of the sensitizing dye include dyes described in the chapter, DSSC, in "Advanced Technology and Material Development of FPD, DSSC, Optical Memory, and Functional Dye" (NTS Inc.). In particular, a dye capable of association is preferred because such a dye accelerates charge separation during photovoltaic conversion. The dye forming association to achieve effect is preferably a dye having the structure represented by [Chemical Formula 12], for example.

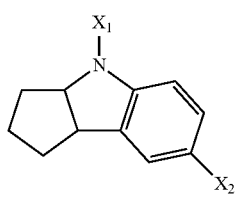

[Chemical Formula 12]

In the structure formula represented by [Chemical Formula 12], each of $X_1$ and $X_2$ is independently an organic group having at least one of an alkyl group, an alkenyl group, an aralkyl group, an aryl group, and a hetero ring, and each may have a substituent. The dye as represented by [Chemical Formula 12] is known to be associative. Such a dye markedly reduces the recombination of electrons and holes present in the electron transport layer 1 and the hole transport layer 5 respectively, and this improves the conversion efficiency of a photoelectric conversion element.

The sensitizing dye contained in the electron transport layer 1 is present in the gel layer 2. In particular, the sensitizing dye is preferably immobilized in the gel layer 2 by physical or chemical action to the organic compound included in the gel layer 2. The sensitizing dye is preferably, homogeneously present in the gel layer 2.

"Sensitizing dye present in the gel layer 2" means that the sensitizing dye is present not only in the surface layer of the gel layer 2 but also in the inside. This allows the gel layer 2 to constantly contain the sensitizing dye in a predetermined amount or more, thereby achieving the output power improvement effect of the photoelectric element 40.

"The state in which the sensitizing dye is present in the gel layer 2" includes "the state in which the sensitizing dye is present in an electrolytic solution included in the gel layer 2" and "the state in which the sensitizing dye physically or chemically interacts with an organic compound included in the gel layer 2 thereby to be supported in the gel layer 2".

"The state in which the sensitizing dye physically interacts with an organic compound included in the gel layer 2 thereby to be supported in the gel layer 2" is, for example, the state in which using, as the organic compound included in the gel layer 2, an organic compound having a structure that prevents the sensitizing dye molecule from moving in the gel layer 2 prevents the sensitizing dye molecule from moving in the gel layer 2. Examples of the structure preventing the sensitizing dye molecule from moving include a structure in which various molecular chains of the organic compound, such as an alkyl chain, exhibit steric hindrance and a structure in which a void space present in molecular chains of the organic compound is so small as to prevent the sensitizing dye molecule from moving.

It is also effective to add a factor exhibiting physical interaction to the sensitizing dye. Effective examples are specifically adding the structure exhibiting steric hindrance due to various molecular chains such as an alkyl chain to the sensitizing dye and bonding two or more sensitizing dye molecules. In order to bond the sensitizing dye molecules to each other, it is effective to use saturated hydrocarbons such as methylene, ethylene, propane-1,3-dienyl, ethylidene, propane-2,2-diyl, alkanediyl, benzylidene, and propylene; unsaturated hydrocarbons such as vinylidene, propene-1,3-diyl, and but-1-ene-1,4-diyl; cyclic hydrocarbons such as cyclohexanediyl, cyclohexenediyl, cyclohexadienediyl, phenylene, naphthalene, and biphenylene; keto and divalent acyl groups such as oxalyl, malonyl, succinyl, glutaryl, adipoyl, alkanedioyl, sebacoyl, fumaroyl, maleoyl, phthaloyl, isophthaloyl, and terephthaloyl; ethers and esters such as oxy, oxymethylenoxy, and oxycarbonyl; sulfur-containing groups such as sulfanediyl, sulfanil, and sulfonyl; nitrogen-containing groups such as imino, nitrilo, hydrazo, azo, azino, diazoamino, urylene, and amide; silicon-containing groups such as silanediyl and disilane-1,2-diyl; or groups formed by substituting the terminal thereof and composite groups thereof. Each of the above groups is desirably bonded to the sensitizing dye through an optionally substituted, straight or branched alkyl group such as methyl, ethyl, i-propyl, butyl, t-butyl, octyl, 2-ethylhexyl, 2-methoxyethyl, benzyl, trifluoromethyl, cyanomethyl, ethoxycarbonylmethyl, propoxyethyl, 3-(1-octylpyridinium-4-yl)propyl, and 3-(1-butyl-3-methylpyridinium-4-yl)propyl and an optionally substituted, straight or branched alkenyl group such as vinyl and allyl.

"The state in which the sensitizing dye chemically interacts with the organic compound included in the gel layer 2 thereby to be supported in the gel layer 2" is the state in which the sensitizing dye is supported in the gel layer 2 by, for example, a covalent bond, a coordinate bond, an ionic bond, a hydrogen bond, a van der Waals bond, and a chemical interaction such as a hydrophobic interaction, a hydrophilic interaction, and an electrostatic interaction, between the sensitizing dye and the organic compound. Immobilizing the sensitizing dye in the gel layer 2 by such a chemical interaction between the sensitizing dye and the organic compound included in the gel layer 2 decreases the distance between the sensitizing dye and the organic compound, and this allows electrons to more efficiently move.

In a gel layer 2 in which the sensitizing dye is immobilized by a chemical interaction between the organic compound and the sensitizing dye, the organic compound and the sensitizing dye preferably include an appropriate functional group, through which the sensitizing dye is immobilized to the organic compound by chemical reaction, for example. Examples of such a functional group include a hydroxy group, a carboxyl group, a phosphate group, a sulfo group, a nitro group, an alkyl group, a carbonate group, an aldehyde group, and a thiol group. Examples of the reaction manner of the chemical reaction through a functional group include condensation reaction, addition reaction, and ring-opening reaction.

For the chemical bonding between the sensitizing dye and the organic compound included in the gel layer 2, a functional group in the sensitizing dye is preferably introduced to the vicinity of a site having a high electron density in a photoexcited sensitizing dye and a functional group of the organic compound in the gel layer 2 is preferably introduced to the vicinity of a site contributing electron transport in the organic compound. This improves the electron transfer efficiency from the sensitizing dye to the organic compound and the electron transport efficiency in the organic compound. In particular, in a photoelectric element in which the sensitizing dye and the organic compound included in the gel layer 2 are bonded through a linking group that bonds an electron cloud of the sensitizing dye to an electron cloud of the organic compound and that has high electron transport properties, electrons can more efficiently move from the sensitizing dye to the organic compound. Usable examples of the chemical bond bonding a n electron cloud of the sensitizing dye to a π electron cloud of the organic compound specifically include an ester linkage having a π electron system.

The sensitizing dye may be bonded to the organic compound when the organic compound is in a monomer state, the organic compound is polymerized, or the organic compound is gelled after polymerization or after the organic compound is gelled. Examples of the specific means include a method of immersing an electron transport layer 1 including the organic compound in a bath containing the sensitizing dye and a method of applying a liquid containing the organic compound and the sensitizing dye to the conductive particle layer 20 to fill pores with the liquid, thereby forming an electron transport layer 1. A plurality of methods may be combined.

In a photoelectric element in which the sensitizing dye is immobilized by physical or chemical action to the organic compound included in the gel layer 2 as above, a closer distance between the sensitizing dye and the organic compound improves the electron transport efficiency between the sensitizing dye and the organic compound.

The amount of the sensitizing dye in the gel layer 2 is appropriately set. In particular, a sensitizing dye contained in an amount of 0.1 part by mass or more with respect to 100 parts by mass of the organic compound gives a sufficiently large amount of the sensitizing dye per unit film thickness of the gel layer 2. This improves light absorption capacity of the sensitizing dye, thereby achieving a high current value. In particular, a sensitizing dye contained in an amount of 1,000 parts by mass or less with respect to 100 parts by mass of the organic compound prevents the sensitizing dye from being present in an excess amount among the organic compound. This prevents the sensitizing dye from interfering with the electron transfer in the organic compound, thereby achieving high electric conductivity.

In the embodiment, as described above, the hole transport layer 5 includes the electrolytic solution that is present between the conductive particle layer 20 and the second electrode 6 and also present in the pores in the conductive particle layer 20, and some of the electrolytic solution forms the gel layer 2. The hole transport layer 5 present between the conductive particle layer 20 and the second electrode 6 may be formed from a different material from that of the electrolytic solution included in the gel layer 2. Examples of the different material from that of the electrolytic solution included in the gel layer 2 include an electrolytic solution dissolving an electrolyte such as a redox couple in a solvent, a solid electrolyte such as a molten salt, a p-type semiconductor such as copper iodide, an amine derivative such as triphenylamine, and an electrically conductive polymer such as polyacetylene, polyaniline, and polythiophene.

The electrolytic solution may be supported on a polymer matrix between the conductive particle layer 20 and the second electrode 6. Examples of a polyvinylidene fluoride polymer compound used as the polymer matrix include a homopolymer of vinylidene fluoride and a copolymer of vinylidene fluoride and an additional polymerizable monomer (suitably a radical polymerizable monomer). Specific examples of the additional polymerizable monomer (hereinafter called copolymerizable monomer) to be copolymerized with vinylidene fluoride include hexafluoropropylene, tetrafluoroethylene, trifluoroethylene, ethylene, propylene, acrylonitrile, vinylidene chloride, methyl acrylate, ethyl acrylate, methyl methacrylate, and styrene.

The hole transport layer 5 may contain a stable radical compound. In such a case, specifically in a photoelectric element 40 serving as a photoelectric conversion element, holes generated by charge separation on a reaction interface are efficiently transported from the hole transport layer 5 to the second electrode 6 by very rapid electron transfer reaction of the stable radical compound. This can improve the photovoltaic conversion efficiency of the photoelectric element 40.

As the stable radical compound, a chemical species having an unpaired electron, that is to say, a compound having a radical can be used without particular limitation. Specifically, a radical compound having nitroxide (NO.) in the molecule is preferred. The stable radical compound preferably has a molecular weight (number average molecular weight) of 1,000 or more. A stable radical compound having a molecular weight of 1,000 or more is preferred from the viewpoint of the stability of a device because such a compound is solid or is likely to be solid at ambient temperature and thus is unlikely to volatilize.

The stable radical compound will be further described. The stable radical compound is a compound that forms a radical compound in at least one process of an electrochemical oxidation reaction and an electrochemical reduction reaction. The type of the radical compound is not particularly limited but is preferably a stable radical compound. The radical compound is particularly preferably an organic compound containing one or both of the structural units of [Chemical Formula 13] and [Chemical Formula 14] below.

[Chemical Formula 13]

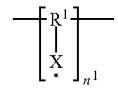

In [Chemical Formula 13], the substituent $R^1$ is a substituted or unsubstituted C2 to C30 alkylene group, C2 to C30 alkenylene group, or C4 to C30 arylene group; X is an oxy radical group, a nitroxyl radical group, a sulfur radical group, a hydrazyl radical group, a carbon radical group, or a boron radical group; and $n^1$ is an integer of 2 or more.

[Chemical Formula 14]

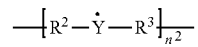

In [Chemical Formula 14], each of the substituents $R^2$ and $R^3$ is independently a substituted or unsubstituted C2 to C30 alkylene group, C2 to C30 alkenylene group, or C4 to C30 arylene group; Y is a nitroxyl radical group, a sulfur radical group, a hydrazyl radical group, or a carbon radical group; and $n^2$ is an integer of 2 or more.

Examples of the stable radical compound containing at least one of the structural units represented by [Chemical Formula 13] and [Chemical Formula 14] include an oxy radical compound, a nitroxyl radical compound, a carbon radical compound, a nitrogen radical compound, a boron radical compound, and a sulfur radical compound. An organic compound forming such a radical compound preferably has a number average molecular weight of $10^3$ to $10^7$ and more preferably $10^3$ to $10^5$.

Specific examples of the oxy radical compound include aryloxy radical compounds represented by [Chemical Formula 15] and [Chemical Formula 16] and semiquinone radical compounds as represented by [Chemical Formula 17].

[Chemical Formula 15]

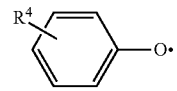

[Chemical Formula 16]

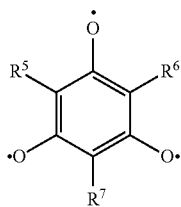

[Chemical Formula 17]

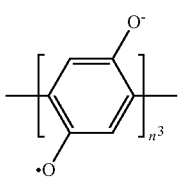

In the chemical formulae [Chemical Formula 15] to [Chemical Formula 17], each of the substituents $R^4$ to $R^7$ is independently a hydrogen atom, a substituted or unsubstituted, aliphatic or aromatic C1 to C30 hydrocarbon group, a halogen group, a hydroxyl group, a nitro group, a nitroso group, a cyano group, an alkoxy group, an aryloxy group, or an acyl group. In the chemical formula [Chemical Formula 17], $n^3$ is an integer of 2 or more. Here, an organic compound forming any of the radical compounds represented by [Chemical Formula 15] to [Chemical Formula 17] preferably has a number average molecular weight of $10^3$ to $10^7$.

Specific examples of the nitroxyl radical compound include a radical compound having a piperidinoxy ring as represented by [Chemical Formula 18], a radical compound having a pyrrolidinoxy ring as represented by [Chemical Formula 19], a radical compound having a pyrrolinoxy ring as represented by [Chemical Formula 20], and a radical compound having a nitronyl nitroxide structure as represented by [Chemical Formula 21].

[Chemical Formula 18]

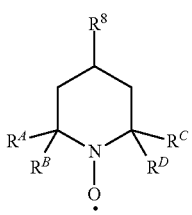

[Chemical Formula 19]

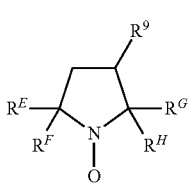

[Chemical Formula 20]

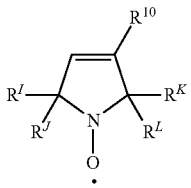

[Chemical Formula 21]

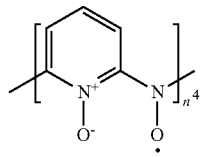

In the chemical formulae [Chemical Formula 18] to [Chemical Formula 20], each of $R^8$ to $R^{10}$ and $R^A$ to $R^L$ is independently a hydrogen atom, a substituted or unsubstituted, aliphatic or aromatic C1 to C30 hydrocarbon group, a halogen group, a hydroxyl group, a nitro group, a nitroso group, a cyano group, an alkoxy group, an aryloxy group, or an acyl group. In the chemical formula [Chemical Formula 21], $n^4$ is an integer of 2 or more. An organic compound forming any of the radical compounds represented by the chemical formulae [Chemical Formula 18] to [Chemical Formula 21] preferably has a number average molecular weight of $10^3$ to $10^7$.

Specific examples of the nitrogen radical compound include a radical compound having a trivalent hydrazyl group as represented by [Chemical Formula 22], a radical compound having a trivalent verdazyl group as represented by [Chemical Formula 23], and a radical compound having an aminotriazine structure as represented by [Chemical Formula 24].

[Chemical Formula 22]

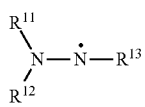

[Chemical Formula 23]

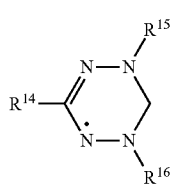

[Chemical Formula 24]

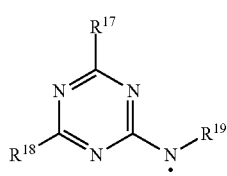

In the chemical formulae [Chemical Formula 22] to [Chemical Formula 24], each of $R^{11}$ to $R^{19}$ is independently a hydrogen atom, a substituted or unsubstituted, aliphatic or aromatic C1 to C30 hydrocarbon group, a halogen group, a hydroxyl group, a nitro group, a nitroso group, a cyano group, an alkoxy group, an aryloxy group, or an acyl group. An organic compound forming any of the radical compounds represented by chemical formulae [Chemical Formula 22] to [Chemical Formula 24] preferably has a number average molecular weight of $10^3$ to $10^7$.

Any of the radical compounds of [Chemical Formula 13] to [Chemical Formula 24] particularly preferably has a number average molecular weight ranging from $10^3$ to $10^7$. An organic polymer compound having a number average molecular weight within the range is excellent in stability. As a result, the photoelectric element 40 can stably work as a photoelectric conversion element or an energy storage device, and a photoelectric element 40 having excellent stability and excellent response speed can be readily obtained.

Among the organic compounds above, an organic compound in a solid state at room temperature is more preferably selected to be used as the stable radical compound. This allows the radical compound to be stably in contact with the electron transport layer 1 and thus can suppress reforming and deterioration due to a side reaction with other chemical substances, melting, or diffusion. As a result, a photoelectric element 40 having excellent stability can be obtained.

To produce the photoelectric element 40, for example, the pores in the conductive particle layer 20 of the first electrode composite 10 is first filled with an organic compound by a wet process or another process, thereby forming the electron transport layer 1 in the pores. Especially for an electron transport layer 1 including what is called a high molecular weight organic compound having a number average molecular weight of 1,000 or more, the wet process is preferably employed from the viewpoint of formability. Examples of the wet process include spin coating, drop casting in which a liquid is dropped and dried, and printing such as screen printing and gravure printing. Next, for a hole transport layer 5 including an electrolytic solution as in the embodiment, in the state in which the conductive particle layer 20 and the second electrode 6 are spaced apart from and facing each other, the space between the first electrode 4 and the second electrode 6 is sealed with an appropriate sealer. Then, the space between the conductive particle layer 20 and the second electrode 6 is filled with the electrolytic solution, thereby forming the hole transport layer 5. Some of the electrolytic solution enters the pores in the conductive particle layer 20 to penetrate the electron transport layer 1 and thus the organic compound included in the electron transport layer 1 is swollen, thereby forming the gel layer 2.

To produce the photoelectric element 40 including a sensitizing dye, the sensitizing dye can be supported on the gel layer 2 at appropriate timing in an appropriate manner as described above.

In the photoelectric element 40 according to the present embodiment, forming the electron transport layer 1 in the pores in the conductive particle layer 20 improves the electron transport properties between the electron transport layer 1 and the first electrode 4 and enlarges the reaction interface. In the pores in the conductive particle layer 20, forming the gel layer 2 from an organic compound included in the electron transport layer 1 and the electrolytic solution further enlarges the reaction interface. This allows the photoelectric element 40 to obtain higher conversion efficiency between light and electricity.

In a photoelectric element 40 serving as a photoelectric conversion element, applying light to the photoelectric element 40 causes a sensitizing dye to absorb light to be excited. The excited electrons generated flow into the electron transport layer 1, then pass through the first electrode 4, and are taken out to the outside. Holes generated in the sensitizing dye are taken out through the hole transport layer 5 and the second electrode 6 to the outside. In this case, the electron transport layer 1 present in the pores in the conductive particle layer 20 causes electrons generated in the electron transport layer 1 to immediately move through the conductive particle layer 20 to the first electrode 4. This suppresses the recombination of electrons and holes and improves the electron transport properties from the electron transport layer 1 to the first electrode 4 in the photoelectric element 40, thereby improving the conversion efficiency from light to electricity by the photoelectric conversion element.

EXAMPLES

Example 1

An electrically conductive glass substrate having a thickness of 0.7 mm and a sheet resistance of 100 Ω/sq. was prepared. The electrically conductive glass substrate includes a glass substrate and a coating film of fluorine-doped $SnO_2$ stacked on a face of the glass substrate. The glass substrate and the coating film of the electrically conductive glass substrate are a first substrate and a first electrode, respectively.

Mixing 10 ml of dispersion liquid containing 30 wt % acicular antimony trioxide (ATO) particles in methyl ethyl ketone, 3 g of indium-tin oxide (ITO) paste, and a binder (methyl methacrylate polymer; PMMA) prepared a mixed liquid. The mixed liquid contains acicular ATO particles, spherical ITO particles, and PMMA in a mass ratio of 30:30:40. The acicular ATO particles have an average major axis length of 0.14 μm and an average minor axis length of 0.015 nm. The spherical ITO particles have an average particle size of 20 nm.

The mixed liquid was applied onto the first electrode in a condition of 1,000 rpm and 20 sec by spin coating, thereby forming a coating. The coating was burned at 450° C. for 1 hour to form a conductive particle layer. Accordingly, an electrode composite was obtained.

Examples 2 and 3

An electrode composite was obtained in the same condition as in Example 1 except that the ratio of the acicular ATO particles, the spherical ITO particles, and PMMA in the mixed liquid for forming the conductive particle layer was changed as shown in Table 1.

Example 4

An electrode composite was obtained in the same condition as in Example 1 except that the acicular ATO particles were replaced with acicular indium-tin oxide (ITO) particles having an average major axis length of 700 nm and an average minor axis length of 68 nm.

Example 5

An electrode composite was obtained in the same condition as in Example 1 except that the acicular ATO particles were replaced with acicular tin oxide (TO) particles and the spherical ITO particles were replaced with spherical TO particles. The acicular TO particles had an average major axis length of 60 nm and an average minor axis length of 11 nm. The spherical TO particles had an average particle size of 20 nm.

Example 6

An electrode composite was obtained in the same condition as in Example 1 except that the spherical ITO particles were replaced with spherical carbon particles and the mixed liquid contained the acicular ATO particles, the spherical carbon particles, and PMMA in a mass ratio of 10:50:40. The spherical carbon particles had an average particle size of 50 nm.

Comparative Example 1

The electrically conductive glass substrate having the same structure as that used in Example 1 was regarded as the electrode composite.

Comparative Example 2

An electrode composite was produced in the same condition as in Example 1 except that no acicular ATO particles were used and the mixed liquid contained the spherical ITO particles and PMMA in a mass ratio of 60:40.

[Verification of Structure of Conductive Particle Layer]

Figure 4:
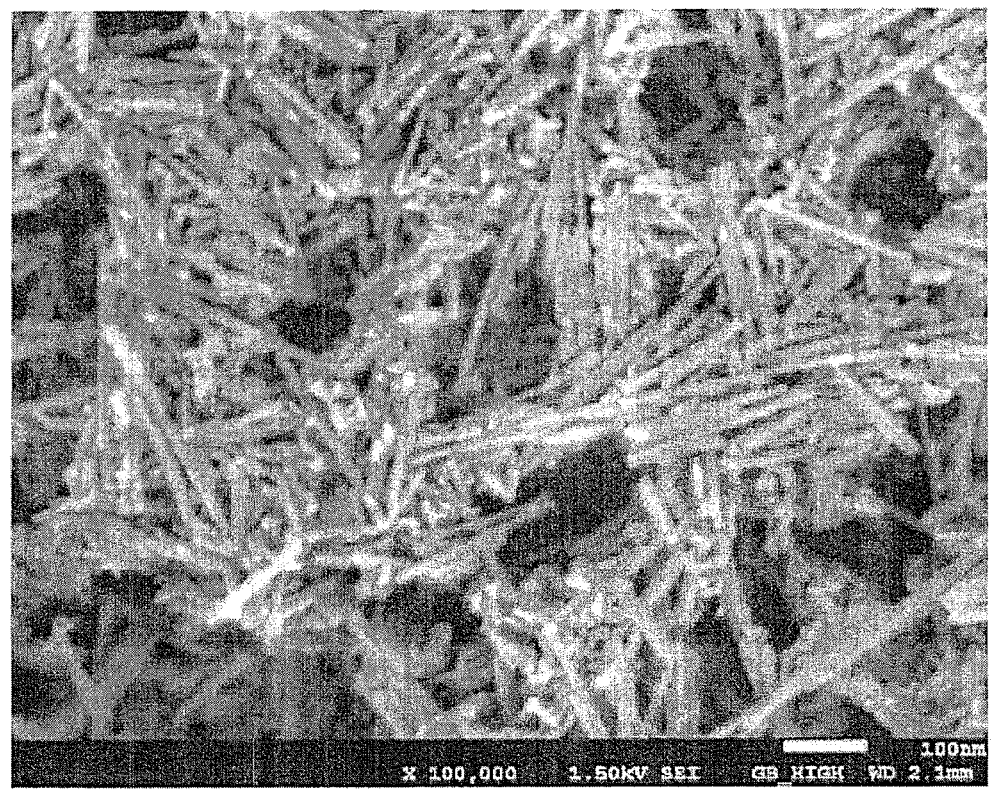
FIG. 4 is an electron microscope image of a conductive particle layer produced in Example 1.

The conductive particle layer produced in Example 1 was observed under an electron microscope, thereby verifying the structure of the conductive particle layer. FIG. 4 shows the result. This verified that the conductive particle layer had a porous structure formed by the interconnection of the conductive particles.

[Evaluation of Electrode Composite]
(Evaluation of Pore Ratio)

The pore size distribution in the conductive particle layer of each electrode composite obtained in Examples 1 to 6 and Comparative Example 2 was observed with AutoPore IV 9510 manufactured by Micromeritics Instrument Corporation. The measurement range was a pore size ranging from 4 nm to 5 μm in consideration of noise and other factors. The measurement condition was as below.

Mercury penetration pressure: about 0.006895 to about 4,136 MPa (about 0.5 psi to 600,000 psi)
Mercury contact angle: 141.3°
Mercury surface tension: 0.00484 N/cm (484 dyn/cm)

The integrated value of the area surrounded by a pore diameter $D/\mu m$-$dV/dlogD/cm^3/g$ curve obtained by the measurement was calculated to determine the below values.

Total volume Vp ($cm^3/g$) of all pores: integrated value within a pore size ranging from 4 nm to 5 μm Total volume V50 ($cm^3/g$) of pores having a pore size of 50 nm or more: integrated value within a pore size of 50 nm to 5 μm Total volume V100 ($cm^3/g$) of pores having a pore size of 100 nm or more: integrated value within a pore size of 100 nm to 5 μm From these measurement results, the values below were calculated as the evaluation value for an electrode composite.

Ratio of pores having a pore size of 50 nm or more: V50/Vp×100(%)

Ratio of pores having a pore size of 100 nm or more: V100/Vp×100(%)

(Evaluation of Transmittance)

The visible light transmittance of an electrode composite was determined with Haze Meter (NDH-2000) manufactured by NIPPON DENSHOKU INDUSTRIES CO., LTD.

(Evaluation of Polymer Packing Capacity)

In a N,N-dimethylformamide (DMF) solution containing 10 mg/L of galvi polymer having a molecular weight of 100,000 and containing 0.5 M of lithium bistrifluoromethanesulfonylimide (LiTFSI), an electrode composite was subjected to cyclic voltammetry (CV) measurement. The measurement condition was a sweep speed of 100 mV/sec and a sweep range from −0.5 to 0.5 V (vs. Ag/AgCl). From the voltammogram obtained by the measurement, a reaction coulomb amount was calculated in the condition above to lead to the reaction amount of the galvi polymer. Based on the measurement result, a polymer packing capacity was calculated in accordance with the equation below.

(Polymer packing capacity)=(polymer reaction amount in Example)/(polymer reaction amount in Comparative Example 1)

(Evaluation of Reaction Area)

Cyclic voltammetry (CV) measurement was carried out using 0.5 M aqueous NaCl solution as an electrolytic solution and using an electrode composite of each of Examples and Comparative Examples as a work electrode and a counter electrode. Based on the obtained result, the electric double layer capacity of each electrode composite of Examples and Comparative Examples was calculated. The measurement condition was a sweep speed of 100 mV/sec and a sweep range from −0.5 to 0.5 V (vs. Ag/AgCl).

Based on the result, the normalized value of a reaction area was calculated while regarding the electric double layer capacity in Comparative Example 1 as a standard.

(Reaction area)=(electric double layer capacity in Example)/(electric double layer capacity in Comparative Example 1)

Table 2 shows each evaluation result.

TABLE 1

| | Mixed liquid composition | | | | | |
|---|---|---|---|---|---|---|
| | Acicular particles | | Spherical particles | | Binder | |
| | Material | Mass ratio | Material | Mass ratio | Material | Mass ratio |
| Example 1 | ATO | 30 | ITO | 30 | PMMA | 40 |
| Example 2 | ATO | 60 | ITO | 0 | PMMA | 40 |
| Example 3 | ATO | 50 | ITO | 10 | PMMA | 40 |
| Example 4 | ITO | 30 | ITO | 30 | PMMA | 40 |
| Example 5 | TO | 30 | TO | 30 | PMMA | 40 |
| Example 6 | ATO | 10 | Carbon | 40 | PMMA | 40 |
| Comparative Example 1 | — | — | — | — | — | — |
| Comparative Example 2 | ATO | 0 | ITO | 40 | PMMA | 40 |

TABLE 2

| | Evaluation | | | | |
|---|---|---|---|---|---|
| | Pore ratio (%) | | | | |
| | Pore size of 50 nm or more | Pore size of 100 nm or more | Transmittance | Polymer packing capacity | Reaction area |
| Example 1 | 81 | 58 | 84 | 5.4 | 210 |
| Example 2 | 64 | 27 | 83 | 5.1 | 179 |
| Example 3 | 73 | 53 | 76 | 4.6 | 120 |
| Example 4 | 59 | 33 | 85 | 3.1 | 150 |
| Example 5 | 52 | 21 | 74 | 3.4 | 140 |
| Example 6 | 54 | 29 | 32 | 3.1 | 260 |
| Comparative Example 1 | — | — | 99 | 1 | 1 |
| Comparative Example 2 | 2 | 8 | 73 | 1.1 | 200 |

The results in Tables 1 and 2 revealed that the electrode composites in Examples had high light transmittance, achieved a large reaction interface, and further had excellent polymer packing capacity.

Figure 5:
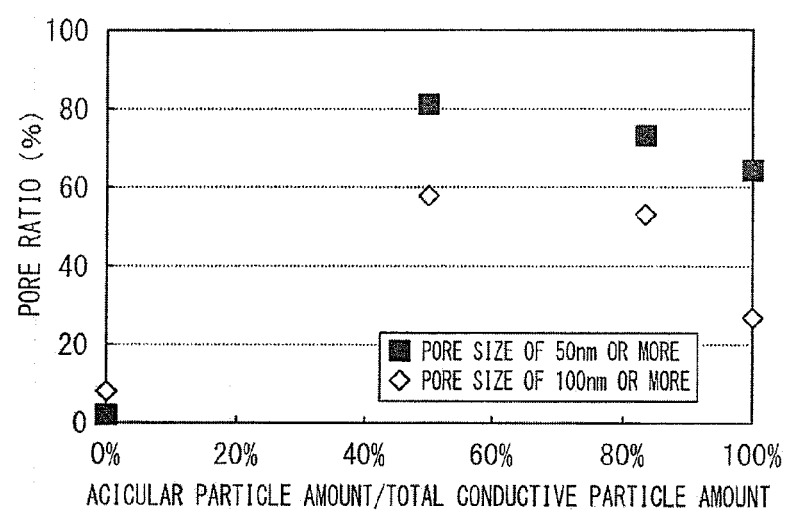
FIG. 5 is a graph showing the relation between the ratio of acicular particles with respect to the whole conductive particles and the ratio of pores.

FIG. 5 is a graph showing the relation between the ratio of acicular particles in the whole conductive particles and the pore ratios of pores having a pore size of 50 nm or more and pores having a pore size of 100 nm or more. In FIG. 5, the plots show the results of examples in which ATO was used as the acicular particles and ITO was used as the spherical particles, that is, the results of Examples 1 to 3 and Comparative Example 2. FIG. 5 demonstrates that Examples 1 to 3 in which the conductive particles contained acicular particles had much higher pore ratios of pores having a pore size of 50 nm or more and pores having a pore size of 100 nm or more than those of Comparative Example 2 in which the conductive particles contained no acicular particles. Among Examples 1 to 3, Examples 1 and 3 in which the conductive particles contained both acicular particles and spherical particles had further higher pore ratios of pores having a pore size of 50 nm or more and pores having a pore size of 100 nm or more than those of Example 2 in which the conductive particles contained acicular particles alone. The conductive particles containing both acicular particles and spherical particles increased the size of pores in the conductive particle layer as demonstrated above.

Example 7

Synthesis of Galvi Monomer

Into a reaction container, 4-bromo-2,6-di-tert-butylphenol (135.8 g; 0.476 mol) and acetonitrile (270 ml) were charged, and in an inert atmosphere, N,O-bis(trimethylsilyl)acetamide (BSA) (106.3 g; 129.6 ml) was further added. The whole was stirred and reacted overnight at 70° C. until a crystal was completely precipitated. The precipitated white crystal was filtered, then was dried under vacuum, and was purified by recrystallization in ethanol, thereby yielding (4-bromo-2,6-di-tert-butylphenoxy)trimethylsilane (150.0 g; 0.420 mol) represented by sign "1" in [Chemical Formula 25] as a white plate crystal.

Next, in a reaction container, (4-bromo-2,6-di-tert-butylphenoxy)trimethylsilane (9.83 g; 0.0275 mol) obtained above was dissolved in tetrahydrofuran (200 ml) in an inert atmosphere and the prepared solution was cooled to −78° C. using dry ice/methanol. To the solution in the reaction container, a hexane solution of 1.58 M n-butyllithium (15.8 ml; 0.025 mol) was added and the whole was stirred at a temperature of 78° C. for 30 minutes for lithiation. Then, to the solution, a tetrahydrofuran solution (75 ml) of methyl 4-bromobenzoate (1.08 g; 0.005 mol, Mw: 215.0, TCI) was added and the whole was stirred from −78° C. to room temperature overnight. This changed the solution color from yellow through pale yellow to dark blue that suggested the generation of an anion. After the reaction, to the solution in the reaction container, a saturated aqueous ammonium chloride solution was added until the solution color was completely changed to yellow and then the solution was extracted with ether/water, thereby yielding a product in a yellow viscous liquid form.

Next, into a reaction container, the product, THF (10 ml), methanol (7.5 ml), and a stirring bar were charged, and the product was dissolved. Next, 10 N HCl (1 to 2 ml) was gradually added until the reaction solution was changed to red-orange and the mixture was stirred for 30 minutes at room temperature. Then, the solvents were removed, and the residue was subjected to extraction with ether/water, solvent removal, fractionation by column chromatography (hexane/chloroform=1/1), and recrystallization in hexane to be purified, thereby yielding (p-bromophenyl)hydrogalvinoxyl (2.86 g; 0.0049 mol) represented by sign "2" in [Chemical Formula 25] as an orange crystal.

Next, in a reaction container, (p-bromophenyl)hydrogalvinoxyl (2.50 g; 4.33 mmol) obtained above was dissolved in toluene (21.6 ml; 0.2 M) in an inert atmosphere. To the solution, 2,6-di-tert-butyl-p-cresol (4.76 mg; 0.0216 mmol), tetrakis(triphenylphosphine)palladium(0) (0.150 g; 0.130 mmol), tri-n-butylvinyltin (1.65 g; 5.20 mmol, Mw: 317.1, TCI) were immediately added, and the mixture was heated and stirred at 100° C. for 17 hours.

The reaction product obtained above was extracted with ether/water, and the solvent was removed. The residue was fractionated by flash column chromatography (hexane/chloroform=1/3) and was further purified by recrystallization in hexane, thereby yielding p-hydrogalvinoxylstyrene (1.54 g; 2.93 mmol) represented by sign "3" in [Chemical Formula 25] as an orange microcrystal.

(Polymerization of Galvi Monomer)

In 2 ml of tetrahydrofuran, 1 g of the galvi monomer (p-hydrogalvinoxylstyrene) obtained in Synthesis of Galvi Monomer above, 57.7 mg of tetraethylene glycol diacrylate, and 15.1 mg of azobisisobutyronitrile were dissolved. Then, the solution was subjected to nitrogen substitution and was refluxed overnight, thereby polymerizing the galvi monomer to yield a galvi polymer represented by sign "4" in [Chemical Formula 25].

(Synthesis of Galvi Monomer)

Into a reaction container, 4-bromo-2,6-di-tert-butylphenol (135.8 g; 0.476 mol) and acetonitrile (270 ml) were charged, and in an inert atmosphere, N,O-bis(trimethylsilyl)acetamide (BSA) (106.3 g; 129.6 ml) was further added. The whole was stirred and reacted overnight at 70° C. until a crystal was completely precipitated. The precipitated white crystal was filtered, then was dried under vacuum, and was purified by recrystallization in ethanol, thereby yielding (4-bromo-2,6-di-tert-butylphenoxy)trimethylsilane (150.0 g; 0.420 mol) represented by sign "1" in [Chemical Formula 25] as a white plate crystal.

Next, in a reaction container, (4-bromo-2,6-di-tert-butylphenoxy)trimethylsilane (9.83 g; 0.0275 mol) obtained above was dissolved in tetrahydrofuran (200 ml) in an inert atmosphere and the prepared solution was cooled to −78° C. using dry ice/methanol. To the solution in the reaction container, a hexane solution of 1.58 M n-butyllithium (15.8 ml; 0.025 mol) was added and the whole was stirred at a temperature of 78° C. for 30 minutes for lithiation. Then, to the solution, a tetrahydrofuran solution (75 ml) of methyl 4-bromobenzoate (1.08 g; 0.005 mol, Mw: 215.0, TCI) was added and the whole was stirred from −78° C. to room temperature overnight. This changed the solution color from yellow through pale yellow to dark blue that suggested the generation of an anion. After the reaction, to the solution in the reaction container, a saturated aqueous ammonium chloride solution was added until the solution color was completely changed to yellow and then the solution was extracted with ether/water, thereby yielding a product in a yellow viscous liquid form.

Next, into a reaction container, the product, THF (10 ml), methanol (7.5 ml), and a stirring bar were charged, and the product was dissolved. Next, 10 N HCl (1 to 2 ml) was gradually added until the reaction solution was changed to red-orange and the mixture was stirred for 30 minutes at room temperature. Then, the solvents were removed, and the residue was subjected to extraction with ether/water, solvent removal, fractionation by column chromatography (hexane/ chloroform=1/1), and recrystallization in hexane to be purified, thereby yielding (p-bromophenyl)hydrogalvinoxyl (2.86 g; 0.0049 mol) represented by sign "2" in [Chemical Formula 25] as an orange crystal.

Next, in a reaction container, (p-bromophenyl)hydrogalvinoxyl (2.50 g; 4.33 mmol) obtained above was dissolved in toluene (21.6 ml; 0.2 M) in an inert atmosphere. To the solution, 2,6-di-tert-butyl-p-cresol (4.76 mg; 0.0216 mmol), tetrakis(triphenylphosphine)palladium(0) (0.150 g; 0.130 mmol), tri-n-butylvinyltin (1.65 g; 5.20 mmol, Mw: 317.1, TCI) were immediately added, and the mixture was heated and stirred at 100° C. for 17 hours.

The reaction product obtained above was extracted with ether/water, and the solvent was removed. The residue was fractionated by flash column chromatography (hexane/chloroform=1/3) and was further purified by recrystallization in hexane, thereby yielding p-hydrogalvinoxylstyrene (1.54 g; 2.93 mmol) represented by sign "3" in [Chemical Formula 25] as an orange microcrystal.

(Polymerization of Galvi Monomer)

In 2 ml of tetrahydrofuran, 1 g of the galvi monomer (p-hydrogalvinoxylstyrene) obtained in Synthesis of Galvi Monomer above, 57.7 mg of tetraethylene glycol diacrylate, and 15.1 mg of azobisisobutyronitrile were dissolved. Then, the solution was subjected to nitrogen substitution and was refluxed overnight, thereby polymerizing the galvi monomer to yield a galvi polymer represented by sign "4" in [Chemical Formula 25].

(Formation of Electron Transport Layer)

In chlorobenzene, 2% by mass of the galvi polymer (sign "4" in [Chemical Formula 25]) was dissolved and dispersed. The solution was applied onto the conductive particle layer of the electrode composite produced in Example 1 by spin coating at 1,000 rpm and was dried at 60° C. and 0.01 MPa for 1 hour, thereby forming an electron transport layer in the pores in the conductive particle layer.

Next, the conductive particle layer was immersed in a saturated solution of a sensitizing dye (D131) represented by [Chemical Formula 26] in acetonitrile for 1 hour.

[Chemical Formula 25]

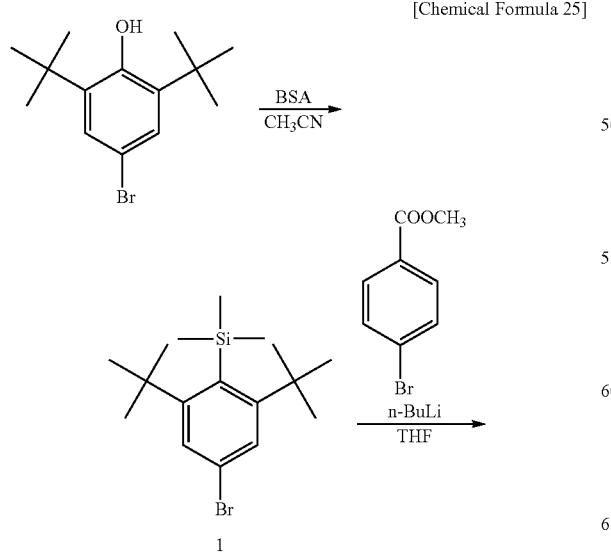

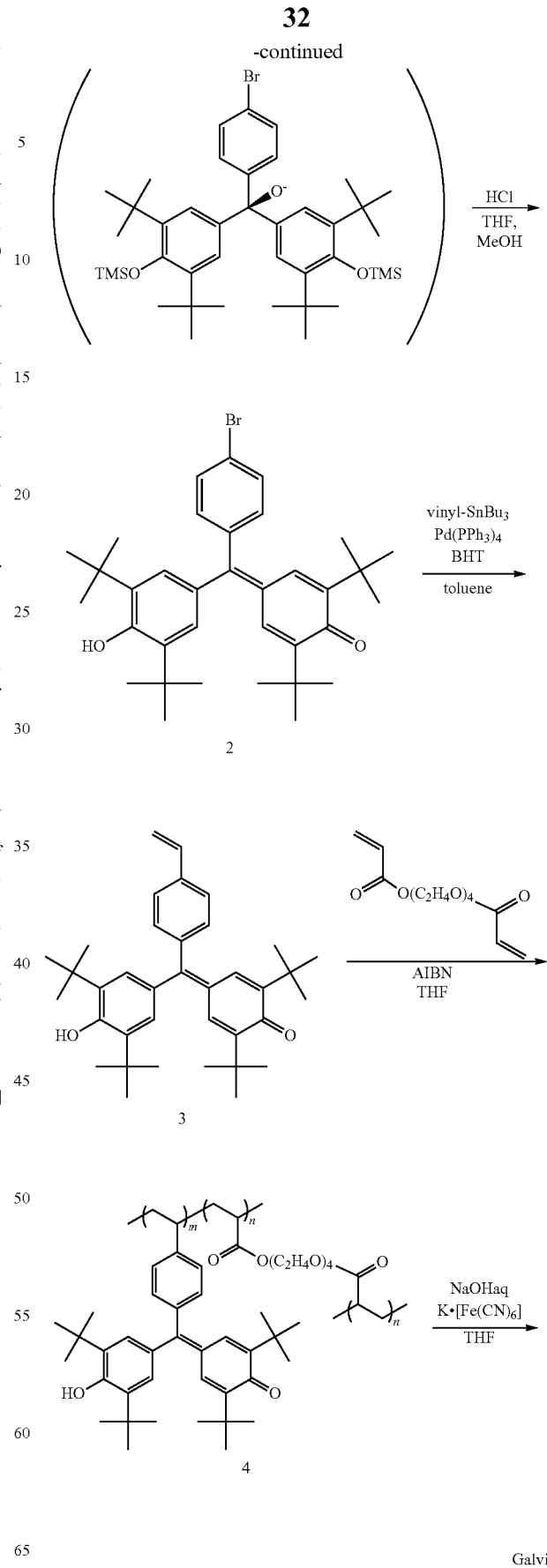

[Chemical Formula 26]

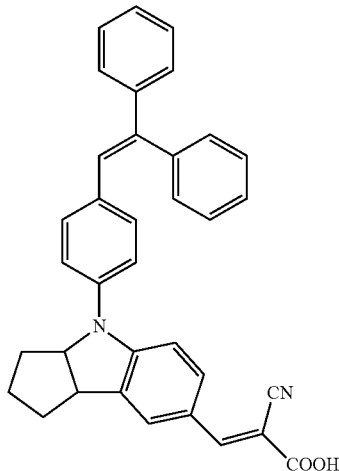

(Production of Element)

The electrically conductive glass substrate having the same structure as that of the electrically conductive glass substrate used for producing the electrode composite in Example 1 was prepared.

In isopropyl alcohol, chloroplatinic acid was dissolved so as to give a concentration of 5 mM. The obtained solution was applied onto the coating film on the electrically conductive glass substrate by spin coating and then was burned at 400° C. for 30 minutes, thereby forming a second electrode.

Next, the electrode composite with the electron transport layer 1 and the electrically conductive glass substrate with the second electrode were arranged so that the conductive particle layer and the second electrode were opposite to each other. A hot-melt adhesive (manufactured by DuPont, Bynel) having a width of 1 mm and a thickness of 50 µm was further interposed between the edges of the conductive particle layer and the second electrode. While the hot-melt adhesive was heated, the electrode composite and the electrically conductive glass substrate were pressurized in the thickness direction, thereby bonding the electrode composite and the electrically conductive glass substrate through the hot-melt adhesive. The hot-melt adhesive had a hole as an inlet for an electrolytic solution. Subsequently, the space between the conductive particle layer and the second electrode was filled with an electrolytic solution through the inlet. Next, the inlet was filled with a UV hardenable resin and UV light was applied to harden the UV hardenable resin, thereby closing the inlet. This formed the hole transport layer 5 including the electrolytic solution and concurrently caused the electrolytic solution to penetrate the electron transport layer 1 and thus the organic compound (galvi polymer) included in the electron transport layer 1 was swollen, thereby forming a gel layer 2.

The electrolytic solution used was an acetonitrile solution containing 1 M 2,2,6,6-tetramethylpiperidin-1-oxyl, 2 mM sensitizing dye (D131), 0.5 M LiTFSI, and 1.6 M N-methylbenzimidazole.

A photoelectric element (photoelectric conversion element) was consequently produced.

Comparative Example 3

Formation of Electron Transport Layer

In chlorobenzene, 2% by mass of the galvi polymer (sign "4" in [Chemical Formula 25]) was dissolved and dispersed. The solution was applied onto the first electrode of the electrode composite (electrically conductive glass substrate) obtained in Comparative Example 1 by spin coating at 1,000 rpm and was dried at 60° C. and 0.01 MPa for 1 hour, thereby forming an electron transport layer having a thickness of 120 nm.

Next, the electron transport layer was immersed in a saturated solution of a sensitizing dye (D131) represented by [Chemical Formula 26] in acetonitrile for 1 hour.

(Production of Element)

The electrically conductive glass substrate having the same structure as that of the electrically conductive glass substrate used for producing the electrode composite in Example 1 was prepared.

In isopropyl alcohol, chloroplatinic acid was dissolved so as to give a concentration of 5 mM. The obtained solution was applied onto the coating film of the electrically conductive glass substrate by spin coating and then was burned at 400° C. for 30 minutes, thereby forming a second electrode.

Next, the electrode composite with the electron transport layer 1 and the electrically conductive glass substrate with the second electrode were arranged so that the electron transport layer and the second electrode were opposite to each other. A hot-melt adhesive (manufactured by DuPont, Bynel) having a width of 1 mm and a thickness of 50 µm was further interposed between the edges of the electron transport layer and the second electrode. While the hot-melt adhesive was heated, the electrode composite and the electrically conductive glass substrate were pressurized in the thickness direction, thereby bonding the electrode composite and the electrically conductive glass substrate through the hot-melt adhesive. The hot-melt adhesive had a hole as an inlet for an electrolytic solution. Subsequently, the space between the electron transport layer and the second electrode was filled with an electrolytic solution through the inlet. Next, the inlet was filled with a UV hardenable resin and UV light was applied to harden the UV hardenable resin, thereby closing the inlet. This formed the hole transport layer including the electrolytic solution and concurrently caused the electrolytic solution to penetrate the electron transport layer and thus the organic compound (galvi polymer) included in the electron transport layer was swollen, thereby forming a gel layer.

The electrolytic solution used was an acetonitrile solution containing 1 M 2,2,6,6-tetramethylpiperidin-1-oxyl, 2 mM sensitizing dye (D131), 0.5 M LiTFSI, and 1.6 M N-methylbenzimidazole.

A photoelectric element (photoelectric conversion element) was consequently produced.

[Evaluation Test]

While irradiating a region having a plane area of 1 cm² in each photoelectric element obtained in Example 7 and Comparative Example 3 with light at 200 lux, the open circuit voltage and the short circuit current of each photoelectric element were determined by IV measurement using Keithley 2400 sourcemeter (Model 2400 general purpose SourceMeter manufactured by Keithley Instruments, Inc). The light source used was a fluorescent light (Rapid Fluorescence Light FLR20S•W/M manufactured by Panasonic Corporation); and the measurement was carried out in an environment at 25° C. The photoelectric conversion element was evaluated in a condition in which the photovoltaic conversion part having an area of 1 cm² was irradiated with light. Table 3 shows the results.

TABLE 3

| | Open circuit voltage (mV) | Short circuit current (μA) |
|---|---|---|
| Example 7 | 570 | 3.7 |
| Comparative Example 3 | 520 | 0.5 |

The results in Table 3 revealed that the short circuit current was particularly, significantly increased in Example 7 and the effect of the electrode composite having a high light transmittance, a large reaction area, and excellent polymer packing capacity was achieved on the photoelectric element.

INDUSTRIAL APPLICABILITY

The electrode composite of the present invention can achieve a reaction interface with a large area and can increase the electron transport properties between the reaction interface and the electrode and thus is applicable to the electrode for a photoelectric element.

In addition, the photoelectric element of the present invention is applicable to, for example, power generation devices by photoelectric conversion, such as a photovoltaic cell and a solar cell, light-emitting devices such as an organic EL device, optical display devices such as an electrochromic display device and electronic paper, and sensor devices sensing, for example, temperature and light.

REFERENCE SIGNS LIST

1 Electron transport layer
2 Gel layer
4 First electrode
5 Hole transport layer
6 Second electrode
10 Electrode composite
20 Conductive particle layer
30 Conductive particles
31 Acicular particles
32 Spherical particles
40 Photoelectric element

The invention claimed is:

1. An electrode composite comprising:
a first electrode; and a conductive particle layer stacked on the first electrode,
wherein the conductive particle layer includes conductive particles containing acicular particles,
the conductive particle layer has a three-dimensional porous network structure, interconnection of the conductive particles forms the three-dimensional network structure, the three-dimensional network structure is joined to the first electrode, and
the conductive particle layer contains pores having a pore size of 50 nm or more in a total volume of 50% or more based on the volume of all pores in the conductive particle layer.

2. An electrode composite comprising:
a first electrode; and a conductive particle layer stacked on the first electrode,
wherein the conductive particle layer is a sintered compact of conductive particles containing acicular particles and is joined to the first electrode, and
the conductive particle layer contains pores having a pore size of 50 nm or more in a total volume of 50% or more based on the volume of all pores in the conductive particle layer.

3. The electrode composite according to claim 1, wherein the acicular particles have an average major axis length ranging from 100 to 1,000 nm.

4. The electrode composite according to claim 1, wherein the conductive particles further contain spherical particles having an average particle size of 100 nm or less.

5. The electrode composite according to claim 1, wherein the conductive particles include particles containing at least one of tin oxide and zinc oxide.

6. The electrode composite according to claim 1, wherein the conductive particles include particles containing at least one of tin oxide and zinc oxide, the tin oxide is doped with at least one of antimony, fluorine, and indium, and the zinc oxide is doped with at least one of aluminum, gallium, and indium.

7. The electrode composite according to claim 1, wherein the conductive particle layer has a thickness of 100 nm or less.

8. A photoelectric element comprising:
the electrode composite according to claim 1; a second electrode arranged opposite to the conductive particle layer of the electrode composite; an electron transport layer and a hole transport layer interposed between the first electrode and the second electrode; and an electrolytic solution,
wherein the electron transport layer includes an organic compound having a redox moiety capable of repeated oxidation-reduction,
the organic compound and the electrolytic solution form a gel layer, and
the pores in the conductive particle layer of the electrode composite are filled with at least some of the gel layer.

9. The electrode composite according to claim 1, wherein the conductive particle layer is a sintered compact of the conductive particles.

10. The photoelectric element according to claim 8, wherein the organic compound is swollen with the electrolytic solution to form the gel layer.

11. The electrode composite according to claim 2, wherein the acicular particles have an average major axis length ranging from 100 to 1,000 nm.

12. The electrode composite according to claim 2, wherein the conductive particles further contain spherical particles having an average particle size of 100 nm or less.

13. The electrode composite according to claim 2, wherein the conductive particles include particles containing at least one of tin oxide and zinc oxide.

14. The electrode composite according to claim 2, wherein the conductive particles include particles containing at least one of tin oxide and zinc oxide, the tin oxide is doped with at least one of antimony, fluorine, and indium, and the zinc oxide is doped with at least one of aluminum, gallium, and indium.

15. The electrode composite according to claim 2, wherein the conductive particle layer has a thickness of 100 nm or less.

16. A photoelectric element comprising:
the electrode composite according to claim 2; a second electrode arranged opposite to the conductive particle layer of the electrode composite; an electron transport layer and a hole transport layer interposed between the first electrode and the second electrode; and an electrolytic solution,
wherein the electron transport layer includes an organic compound having a redox moiety capable of repeated oxidation-reduction,
the organic compound and the electrolytic solution form a gel layer, and
the pores in the conductive particle layer of the electrode composite are filled with at least some of the gel layer.

17. The photoelectric element according to claim 16, wherein the organic compound is swollen with the electrolytic solution to form the gel layer.

* * * * *